United States Patent
Ha et al.

(10) Patent No.: US 12,435,265 B2
(45) Date of Patent: Oct. 7, 2025

(54) QUANTUM DOT COMPOSITION, LIGHT-EMITTING ELEMENT AND DISPLAY DEVICE INCLUDING THE SAME

(71) Applicant: Samsung Display Co., Ltd., Yongin-si (KR)

(72) Inventors: Jaekook Ha, Seoul (KR); Yunku Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 889 days.

(21) Appl. No.: 17/451,602

(22) Filed: Oct. 20, 2021

(65) Prior Publication Data

US 2022/0195289 A1 Jun. 23, 2022

(30) Foreign Application Priority Data

Dec. 17, 2020 (KR) .................. 10-2020-0176928

(51) Int. Cl.
| | |
|---|---|
| C09K 11/02 | (2006.01) |
| B82Y 20/00 | (2011.01) |
| B82Y 40/00 | (2011.01) |
| H10K 50/115 | (2023.01) |
| H10K 59/38 | (2023.01) |

(52) U.S. Cl.
CPC .......... *C09K 11/025* (2013.01); *H10K 50/115* (2023.02); *H10K 59/38* (2023.02); *B82Y 20/00* (2013.01); *B82Y 40/00* (2013.01)

(58) Field of Classification Search
CPC .................................................. C09K 11/025
See application file for complete search history.

(56) References Cited

U.S. PATENT DOCUMENTS

| | | | |
|---|---|---|---|
| 10,209,560 B2 | 2/2019 | Lee et al. | |
| 10,287,498 B2* | 5/2019 | Zhou | ...................... H10K 59/38 |
| 10,439,155 B2 | 10/2019 | Park et al. | |
| 10,526,535 B2 | 1/2020 | Qui et al. | |

(Continued)

FOREIGN PATENT DOCUMENTS

| | | | |
|---|---|---|---|
| CN | 105062462 A | | 11/2015 |
| CN | 106032468 A | * | 10/2016 |

(Continued)

OTHER PUBLICATIONS

Computer-generated English-language translation of KR-20120138165-A.*

(Continued)

*Primary Examiner* — Vu A Nguyen
(74) *Attorney, Agent, or Firm* — Womble Bond Dickinson (US) LLP

(57) ABSTRACT

A quantum dot composition according to one or more embodiments includes a quantum dot, a first ligand including a first head portion bonded to a surface of the quantum dot and a first tail portion having a crosslinkable functional group at a terminal of the first ligand, and a second ligand bonded to the surface of the quantum dot and being shorter in length than the first ligand. A quantum dot composition according to one or more embodiments is applied to a light-emitting element and a display device, and thus, it is possible to improve a luminous efficiency and element lifespan of the light-emitting element and the display device.

15 Claims, 13 Drawing Sheets

(56) References Cited

U.S. PATENT DOCUMENTS

| | | | |
|---|---|---|---|
| 10,942,450 B2* | 3/2021 | Chae | H10K 85/361 |
| 11,258,026 B2* | 2/2022 | Chen | H10K 50/115 |
| 11,958,999 B2* | 4/2024 | Mei | C09D 11/50 |
| 12,228,824 B2 | 2/2025 | Rogojina et al. | |
| 2017/0115562 A1 | 4/2017 | Kim et al. | |
| 2019/0276734 A1* | 9/2019 | Kim | H10K 59/12 |
| 2020/0172802 A1* | 6/2020 | Ahn | H05B 33/14 |
| 2021/0371737 A1* | 12/2021 | Jung | C09K 11/025 |

FOREIGN PATENT DOCUMENTS

| | | | | | |
|---|---|---|---|---|---|
| CN | 107102514 A | | 8/2017 | | |
| CN | 109378395 A | | 2/2019 | | |
| CN | 110305656 A | * | 10/2019 | | C09K 11/025 |
| CN | 110590549 A | * | 12/2019 | | C07C 53/128 |
| CN | 110752303 A | | 2/2020 | | |
| CN | 111512452 A | | 8/2020 | | |
| KR | 20120138165 A | * | 12/2012 | | |
| KR | 10-1223671 B1 | | 1/2013 | | |
| KR | 1828214 B1 | * | 2/2018 | | C09D 5/22 |
| KR | 10-2018-0059363 A | | 6/2018 | | |
| KR | 10-2019-0009763 A | | 1/2019 | | |
| KR | 20190000759 A | | 1/2019 | | |
| KR | 10-2019-0029193 A | | 3/2019 | | |
| KR | 10-1982011 B1 | | 5/2019 | | |
| KR | 10-2019-0106819 A | | 9/2019 | | |
| KR | 1020210149971 | | 12/2021 | | |
| WO | 2019211257 A1 | | 11/2019 | | |

OTHER PUBLICATIONS

Computer-generated English-language translation of CN-106032468-A.*

Computer-generated English-language translation of CN-110305656-A.*

Jong-Jin Park et al., "Photopatternable Quantum dots Forming Quasi-Ordered Arrays", Nano Letters, Jun. 28, 2010, pp. 2310-2317, vol. 10, American Chemical Society.

Chinese Examination report dated Aug. 22, 2025, in corresponding Chinese Patent Application No. CN 202111511182.5 (8 pages).

* cited by examiner

QUANTUM DOT COMPOSITION, LIGHT-EMITTING ELEMENT AND DISPLAY DEVICE INCLUDING THE SAME

CROSS-REFERENCE TO RELATED APPLICATIONS

This application claims priority to and the benefit of Korean Patent Application No. 10-2020-0176928, filed on Dec. 17, 2020, the entire content of which is hereby incorporated by reference.

BACKGROUND

1. Field

One or more aspects of embodiments of the present disclosure herein relate to a quantum dot composition, a light-emitting element including a light-emitting layer formed from the quantum dot composition, and a display device including the same.

Description of the Related Art

Various display devices used in multimedia devices, such as a television, a mobile phone, a tablet computer, a navigation system, and/or a game console, are being developed. In such a display device, a self-luminous display element is used to achieve display of images by emitting light from a light-emitting material containing an organic compound.

In addition, development of a light-emitting element using quantum dots as a light-emitting material is in progress in order to improve the color reproducibility of a display device, and there is a need (or desire) to improve the luminous efficiency and lifespan of a light-emitting element using quantum dots.

SUMMARY

One or more aspects of embodiments of the present disclosure are directed toward a quantum dot composition that may exhibit an improved luminous efficiency characteristic when being used in a light-emitting layer of a light-emitting element.

One or more aspects of embodiments of the present disclosure are directed toward a light-emitting element having an improved luminous efficiency by including, in the light-emitting layer, quantum dots with heterogeneous ligands bonded to the surfaces thereof.

One or more aspects of embodiments of the present disclosure are directed toward a display device exhibiting an improved luminous efficiency by including a light-emitting element that has, in the light-emitting layer, quantum dots with heterogeneous ligands bonded to the surfaces thereof.

One or more embodiments of the present disclosure provide a quantum dot composition including a quantum dot; a first ligand including a first head portion bonded to a surface of the quantum dot and a first tail portion having a crosslinkable functional group at a terminal of the first ligand; and a second ligand bonded to the surface of the quantum dot and being shorter in length than the first ligand.

In one or more embodiments, the crosslinkable functional group may be a thermally crosslinkable functional group.

In one or more embodiments, the crosslinkable functional group may be a vinyl group, a hydroxy group, a carboxyl group, an epoxy group, an amide group, an amine group, an azide group, an oxetanyl group, and/or an isocyanate group.

In one or more embodiments, the second ligand may include a second head portion bonded to the surface of the quantum dot and a second tail portion and the second tail portion may include at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, and/or an ethoxylated polyethylenimine moiety.

In one or more embodiments, the first ligand and the second ligand may be each a monodentate ligand or a bidentate ligand.

In one or more embodiments, the first head portion and the second head portion each may include a thiol group, a dithioic acid group, a phosphine group, a catechol group, an amine group, and/or a carboxylic acid group.

In one or more embodiments, the first ligand may further include a chain portion connecting the first head portion and the first tail portion, and the chain portion may have 2 to 20 carbons.

In one or more embodiments, the chain portion may further include an amine group, an oxy group, a thio group, an ester group, an ether group, an aryl group, and/or an amide group.

In one or more embodiments, the first ligand may be represented by Formula A or Formula B.

wherein, in Formula A and Formula B, X, $X_1$, and $X_2$ are each independently S or NH, Y is represented by any one of Formulae 1 to 7 below.

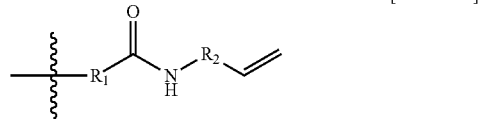

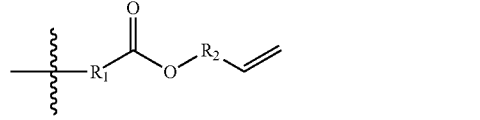

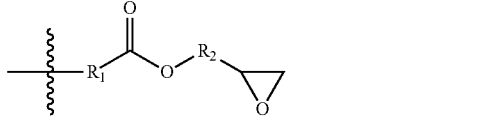

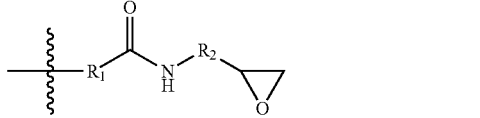

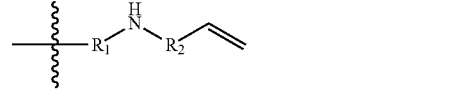

[Formula 6]
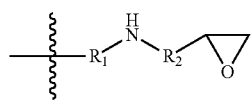

[Formula 7]
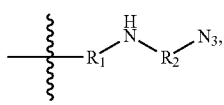

in Formulae 1 to 7,

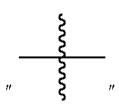

means a position connected to the X, $X_1$ or $X_2$, and $R_1$ and $R_2$ are each independently an alkyl group having 1 to 20 carbon atoms, where the sum of carbon atoms of $R_1$ and $R_2$ is 20 or less.

In one or more embodiments, the electron-withdrawing group may be a nitro group, a thioamide group, an amide group, a fluorine group, a cyano group, an ester group or a carbonyl group, and the electron-donating group may be an aryl group having 6 to 20 ring-forming carbon atoms, an amine group, an alkoxy group and/or a thioether group.

In one or more embodiments, the second ligand may be represented by any one of Formulae 8 to 15 below.

[Formula 8]
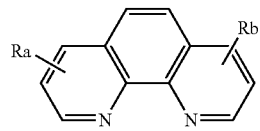

[Formula 9]
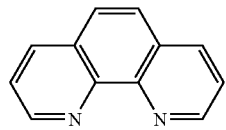

[Formula 10]
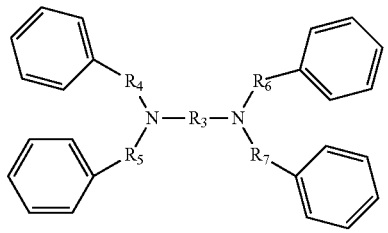

[Formula 11]
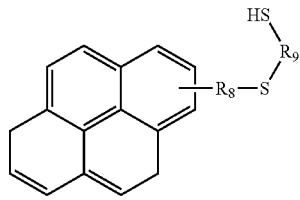

[Formula 12]
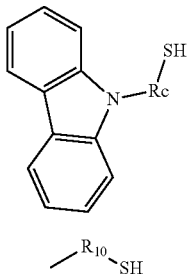

[Formula 13]
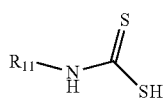

[Formula 14]
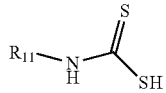

[Formula 15]
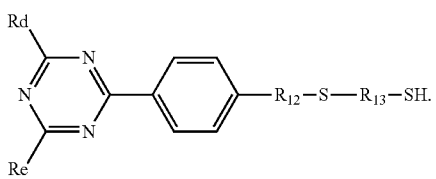

In Formulae 8 to 15, Ra to Re are each independently an alkyl group having 1 to 3 carbon atoms or an aryl group having 6 to 12 ring-forming carbon atoms, $R_1$ to $R_9$, and $R_{12}$ and $R_{13}$ are each independently a direct bond or an alkyl group having 1 to 3 carbon atoms, $R_{10}$ and $R_{11}$ are each independently an alkyl group having 3 to 8 carbon atoms.

In one or more embodiments, the quantum dot may further include an organic solvent and is dispersed in the organic solvent.

In one or more embodiments of the present disclosure, a light-emitting element include a first electrode; a second electrode facing the first electrode; and a light-emitting layer between the first electrode and the second electrode and having a plurality of quantum dot complexes, wherein each of the plurality of quantum dot complexes may include a quantum dot, a first ligand bonded to a surface of the quantum dot, and a second ligand shorter than the first ligand and bonded the surface of to the quantum dot, and the first ligand is to bind to another first ligand adjacent thereto.

In one or more embodiments, the first ligand may include a first head portion bonded to the surface of the quantum dot, and the first head portion may include a thiol group, a dithioic acid group, a phosphine group, a catechol group, an amine group, and/or a carboxylic acid group.

In one or more embodiments, the first ligand may further include a chain portion connected to the first head portion, and the chain portion may have 2 to 20 carbon atoms.

In one or more embodiments, the second ligand may include at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, and/or an ethoxylated polyethylenimine moiety.

In one or more embodiments of the present disclosure, a display device includes a display panel; and a light conversion layer on the display panel and having at least one light control part, wherein the at least one light control part includes a quantum dot, a first ligand bonded to a surface of the quantum dot, and a second ligand shorter than the first ligand, and the first ligand is to bind to a first ligand bonded to another quantum dot.

In one or more embodiments, the display panel may include a light-emitting element to generate first light, and the light conversion layer may have a first light control part to transmit first color light, a second light control part to convert first color light into second color light, and a third light control part to convert first color light into third color light.

In one or more embodiments, the first ligand may include a first head portion containing a hydrophilic group bonded to the surface of the quantum dot; a chain portion containing an amine group, an oxy group, a thio group, an ester group, an ether group, an aryl group, and/or an amide group; and a first tail portion that is to bind to another first ligand bonded to another quantum dot.

In one or more embodiments, the second ligand may include a second head portion including a hydrophilic group bonded to the surface of the quantum dot; and a second tail portion including at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, and/or an ethoxylated polyethylenimine moiety.

In one or more embodiments, the display device may further include a color filter layer on the light conversion layer, wherein the color filter layer may include a first filter to transmit first color light; a second filter to transmit second color light; and a third filter to transmit third color light.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
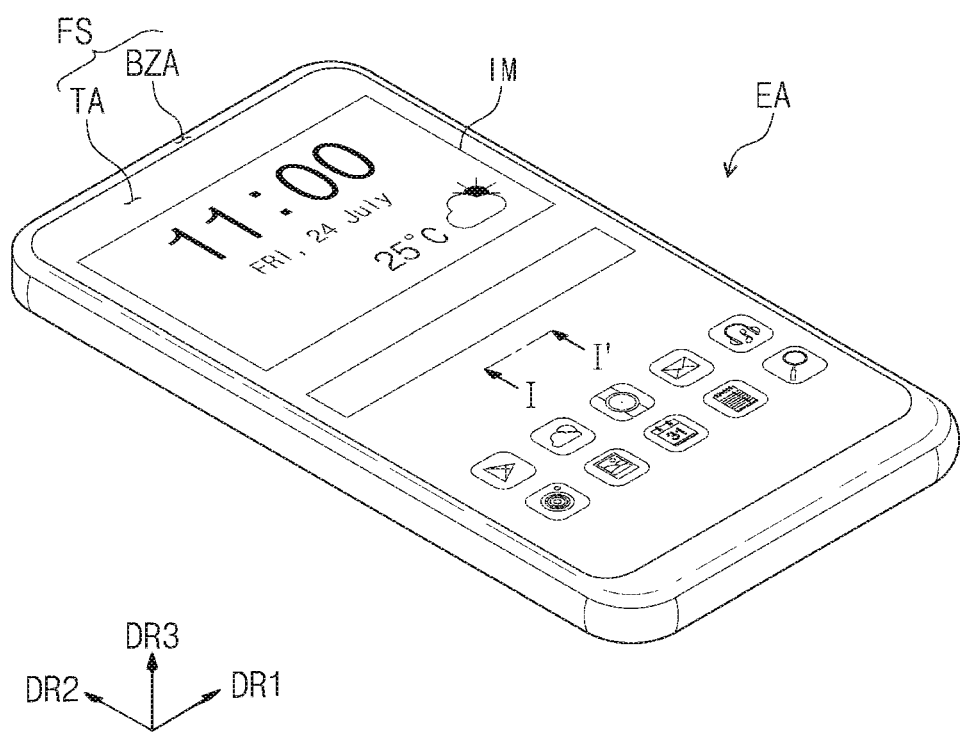
FIG. 1 is an assembled perspective view of an electronic device according to one or more embodiments.

As the present disclosure allows for various changes and numerous embodiments, particular embodiments will be illustrated in the drawings and described in more detail in the text. However, this is not intended to limit the present disclosure to the specific disclosed form, and it should be understood to include all modifications, equivalents, and substitutes included in the spirit and scope of the present disclosure.

It will be understood that when an element or layer is referred to as being "on", "connected to" or "coupled to" another element or layer, it can be directly on, connected or coupled to the other element or layer (without any intervening elements or layers therebetween), or intervening elements or layers may be present.

On the other hand, in the present application, "directly on" means that there is no layer, film, region, plate, or the like added between the portion of the layer, film, region. For example, "directly disposed" and "directly on" may mean a layer or member on (e.g., disposed on) another layer or member without additional members, such as adhesive members, between the two layers or two members.

Like numbers refer to like elements throughout. The thicknesses and the ratios and the dimensions of the elements are exaggerated for effective description of the technical contents.

As used herein, the term "and/or" includes any and all combinations of one or more of the associated listed items. Further, the use of "may" when describing embodiments of the present disclosure refers to "one or more embodiments of the present disclosure".

The terms first, second, etc. may be used to describe various elements, but the elements should not be limited by the terms. The terms are used only for the purpose of distinguishing one component from another. For example, without departing from the scope of the present disclosure, the first component may be referred to as a second component, and similarly, the second component may also be referred to as a first component. Singular expressions include plural expressions unless the context clearly indicates otherwise.

In addition, terms such as "below", "below", "above", "above", etc. are used to describe the relationship between the components shown in the drawings. The terms are relative concepts and are explained based on the directions indicated in the drawings.

Unless otherwise defined, all terms (including technical and scientific terms) used herein have the same meaning as commonly understood by one of ordinary skill in the art to which this disclosure belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terms "include," "comprise," and "have" are intended to indicate the presence of a feature, number, step, action, component, part, or combination thereof described in the specification, one or more other features, numbers, or steps. It should be understood that it does not preclude the existence or addition possibility of further operations, components, parts or combinations thereof.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, "disposed" may refer to being provided and/or positioned.

Hereinafter, a quantum dot composition, a light-emitting element and a display device including the same according to one or more embodiments of the present disclosure will be described in more detail with reference to the accompanying drawings.

Figure 2:
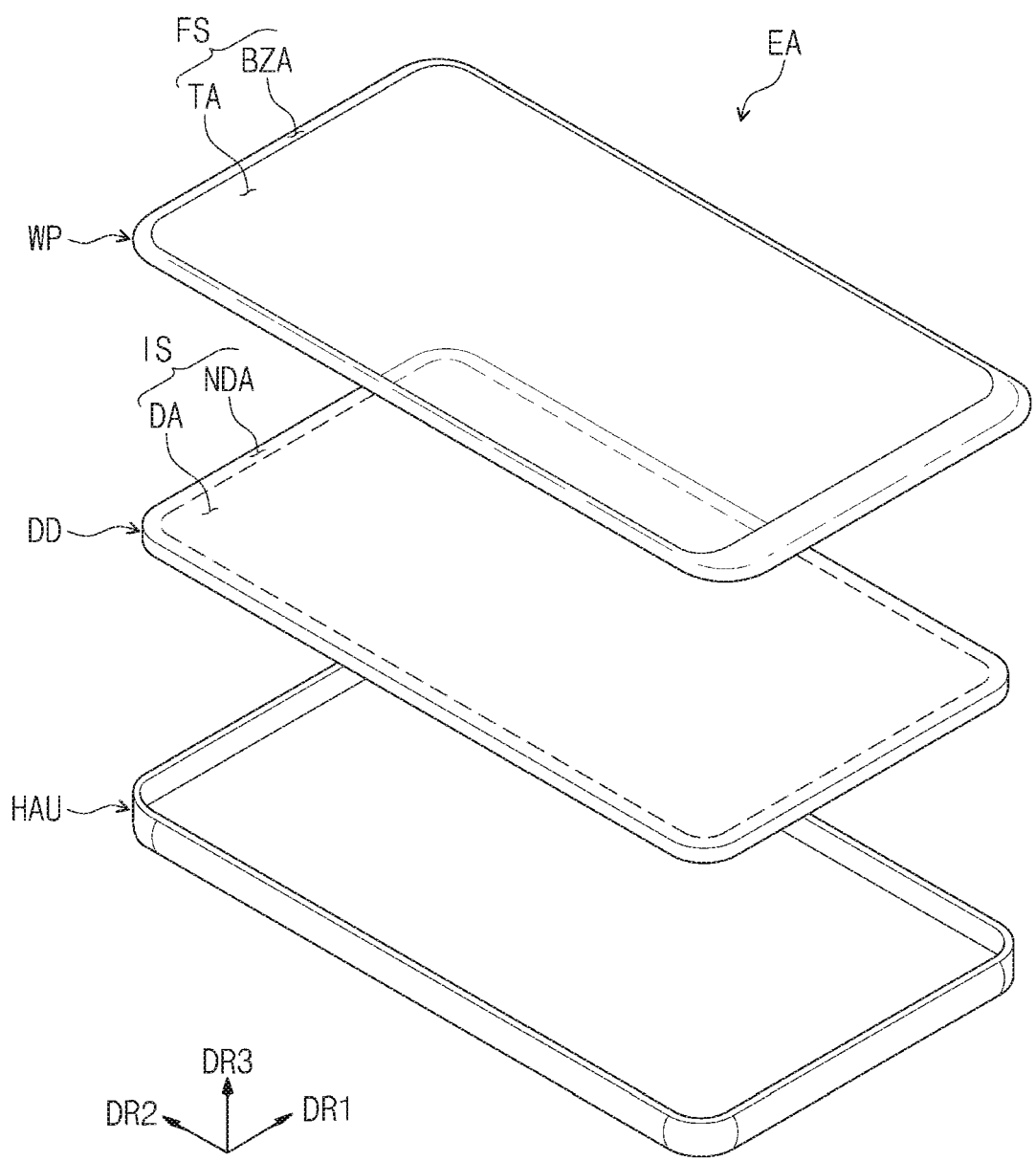
FIG. 2 is an exploded perspective view of an electronic device according to one or more embodiments.
Figure 3:
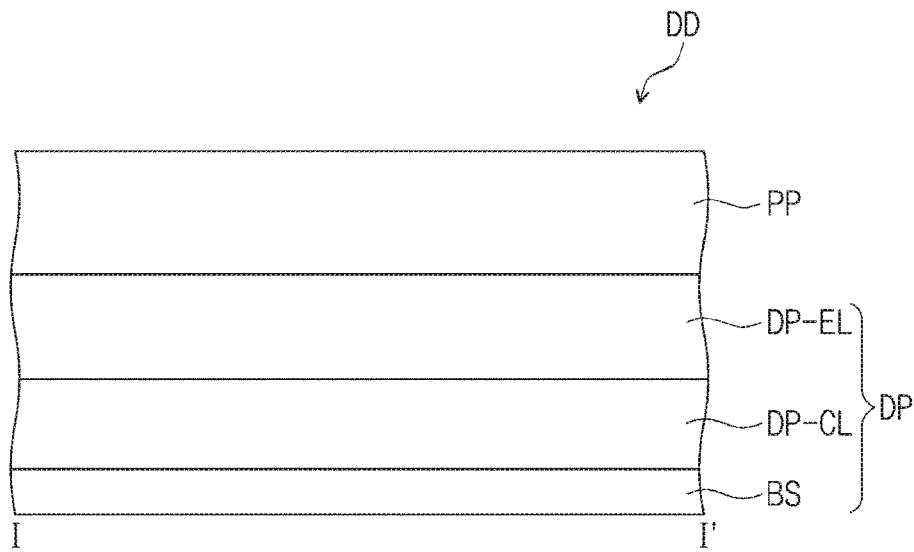
FIG. 3 is a cross-sectional view of a display device according to one or more embodiments.
Figure 4:
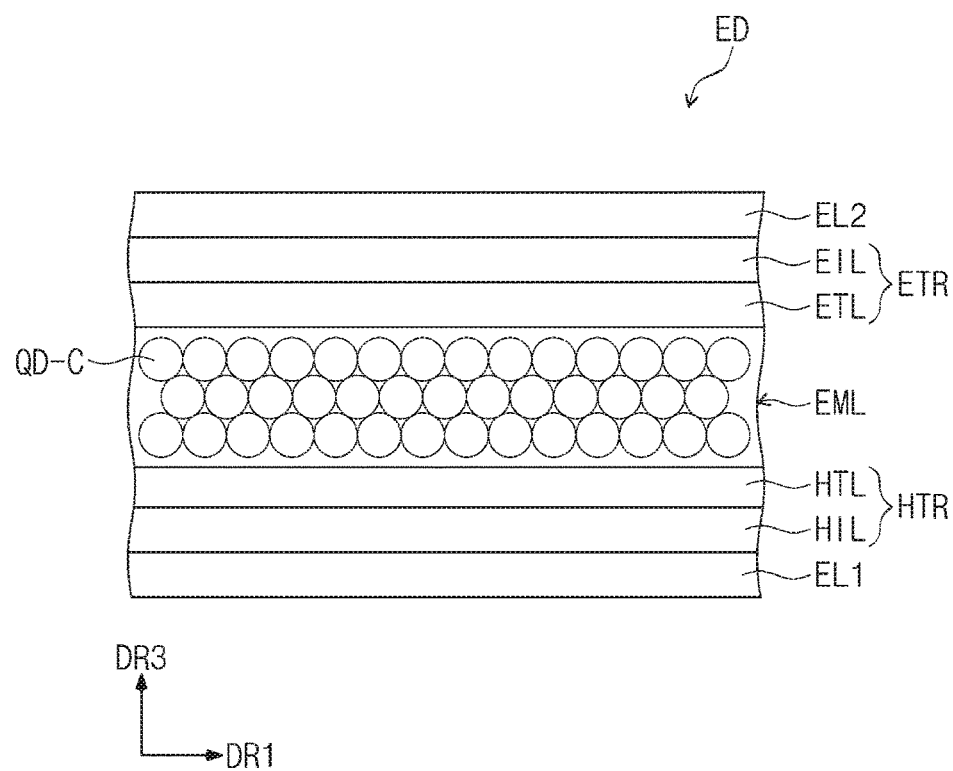
FIG. 4 is a cross-sectional view of a light-emitting element according to one or more embodiments.

FIG. 1 is a perspective view illustrating one or more embodiments of an electronic device EA. FIG. 2 is an exploded perspective view of an electronic device EA according to one or more embodiments. FIG. 3 is a cross-sectional view of a display device DD according to one or more embodiments. FIG. 4 is a cross-sectional view of a light-emitting element ED according to one or more embodiments.

In one or more embodiments, an electronic device EA may be a large electronic device such as a television, a monitor, and/or an external billboard. In one or more embodiments, the electronic device EA may be a small- and/or medium-sized electronic device such as a personal computer, a notebook computer, a personal digital terminal, a car navigation unit, a game machine, a smartphone, a tablet, and/or a camera. However, these are presented only as examples, and the electronic device EA may employ other suitable electronic devices without departing from the present disclosure. In one or more embodiments, the electronic device EA is illustrated as a smart phone by way of an example.

The electronic device EA may display an image IM through a front surface FS. The image IM may include a dynamic (e.g., moving) image as well as a still image. FIG. 1 illustrates that the front surface FS is parallel to a plane defined by a first direction DR1 and a second direction DR2 crossing or intersecting the first direction DR1. However, this is an example, and in other embodiments, the front surface FS of the electronic device EA may have a curved shape.

A direction in which the image IM is displayed is indicated by a third direction DR3, which may correspond to a direction normal to the front surface FS of the electronic device EA, that is, the thickness direction of the electronic device EA. A front surface (or upper surface) and a rear surface (or lower surface) of each member may be defined (e.g., their facing directions may be defined) by the third direction DR3.

A fourth direction DR4 (FIG. 14) may be a direction between the first direction DR1 and the second direction DR2. The fourth direction DR4 may be positioned on a surface parallel to a surface defined by the first direction DR1 and the second direction DR2. However, the directions indicated by the first to fourth directions DR1, DR2, DR3, and DR4 are relative concepts and may be converted to other directions.

In one or more embodiments, the electronic device EA may include a foldable display device including a folding region and a non-folding region, and/or a bendable display device including at least one bendable part.

The electronic device EA may include a display device DD and a housing HAU. The front surface FS of the electronic device EA may correspond to a front surface of the display device DD, and may correspond to a front surface of a window WP. Accordingly, the front face of the electronic device EA, the front face of the display device DD, and the front face of the window WP are denoted as the same reference numeral FS.

The housing HAU may accommodate the display device DD. The housing HAU may be disposed to cover the display device DD such that an upper surface of the display device DD, which is a display surface IS, is exposed. The housing HAU covers a side surface and a bottom surface of the display device DD, and may expose an entire upper surface of the display device DD. However, one or more embodiments of the present disclosure is not limited thereto, and the housing HAU may cover not only the side surface and the bottom surface of the display device DD, but also a part of the upper surface.

In the electronic device EA according to one or more embodiments, the window WP may include an optically transparent insulating material. The window WP may include a transmission area TA and a bezel area BZA. The front surface FS of the window WP including the transmission area TA and the bezel area BZA corresponds to the front surface FS of the electronic device EA.

FIGS. 1 and 2 illustrate that the transmission area TA has a rectangular shape in which vertices are rounded, but embodiments of the present disclosure are not limited thereto. Thus, the transmission area TA may have various suitable shapes.

The transmission area TA may be an optical transmission area. The bezel area BZA may have a relatively low light transmittance compared to that of the transmission area TA. The bezel area BZA may have a set or predetermined color. The bezel area BZA is adjacent to the transmission area TA and may surround (or be around) the transmission area TA. The bezel area BZA may define the shape of the transmission area TA. However, one or more embodiments of the present disclosure are not limited to the illustrated one, and the bezel area BZA may be disposed adjacent to only one side of the transmission area TA, or a portion of the bezel area BZA may be omitted.

The display device DD may be disposed under the window WP. In this specification, "below" may mean a direction opposite to a direction in which the display device DD provides an image.

In one or more embodiments, the display device DD may be a component that substantially generates an image IM. The image IM generated by the display device DD is displayed on the display surface IS, and is visually recognized by a user from the outside through the transmission area TA. The display device DD includes a display area DA and a non-display area NDA. The display area DA may be an area that is activated in response to an electrical signal. The non-display area NDA may be an area covered by the bezel area BZA. The non-display area NDA is adjacent to the display area DA. The non-display area NDA may surround (or be around) the display area DA.

Referring to FIG. 3, the display device DD may include a display panel DP and a light control layer PP disposed on the display panel DP. The display panel DP may include a display element layer DP-EL. The display element layer DP-EL includes a light-emitting element ED.

The light control layer PP may be disposed on the display panel DP to control reflected light of external light at the display panel DP. For example, the light control layer PP may include a polarizing layer and/or a color filter layer.

In the display device DD of one or more embodiments, the display panel DP may be a light-emitting display panel. For example, the display panel DP may be a quantum dot light-emitting display panel including a quantum dot light-emitting element. However, one or more embodiments of the present disclosure are not limited thereto.

The display panel DP may include a base substrate BS, a circuit layer DP-CL disposed on the base substrate BS, and a display element layer DP-EL disposed on the circuit layer DP-CL.

The base substrate BS may be a member that provides a base surface on which the display element layer DP-EL is disposed. The base substrate BS may be a glass substrate, a metal substrate, a plastic substrate, and/or the like. However, one or more embodiments of the present disclosure are not limited thereto, and the base substrate BS may be an inorganic layer, an organic layer, or a composite material layer (e.g., including an organic material and an inorganic material). The base substrate BS may be a flexible substrate that may be easily bendable and/or foldable.

In one or more embodiments, the circuit layer DP-CL may be disposed on the base substrate BS, and the circuit layer DP-CL may include a plurality of transistors. The transistors may each include a control electrode, an input electrode, and an output electrode. For example, the circuit layer DP-CL may include a switching transistor and a driving transistor for driving the light-emitting element ED of the display element layer DP-EL.

FIG. 4 illustrates a light-emitting element ED according to one or more embodiments. Referring to FIG. 4, the light-emitting element ED according to one or more embodiments includes a first electrode EL1, a second electrode EL2 facing the first electrode EL1, and a plurality of functional layers disposed between the first electrode EL1 and the second electrode EL2 and including a light-emitting layer EML.

The plurality of functional layers may include a hole transport region HTR disposed between the first electrode EL1 and the light-emitting layer EML, and an electron transport region ETR disposed between the light-emitting layer EML and the second electrode EL2. In one or more embodiments, a capping layer may be further disposed on the second electrode EL2 in one or more embodiments.

Each of the hole transport region HTR and the electron transport region ETR may include a plurality of sub-functional layers. For example, the hole transport region HTR may include, as sub-functional layers, a hole injection layer HIL and a hole transport layer HTL, and the electron transport region ETR may include, as sub-functional layers, an electron injection layer EIL and an electron transport layer ETL. However, one or more embodiments of the present disclosure are not limited thereto, and the hole transport region HTR may further include an electron blocking layer as a sub-functional layer, and the electron transport region ETR may further include a hole blocking layer as a sub-functional layer.

In the light-emitting element ED according to one or more embodiments, the first electrode EL1 has a conductivity. The first electrode EL1 may be formed of a metal alloy or any suitable conductive compound. The first electrode EL1 may be an anode. The first electrode EL1 may be a pixel electrode.

In the light-emitting element ED according to one or more embodiments, the first electrode EL1 may be a positive electrode or a negative electrode. However, one or more embodiments of the present disclosure are not limited thereto. In one or more embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, and/or a mixture thereof (e.g., a mixture of Ag and Mg). In one or more embodiments, the first electrode EL1 may have a multilayer structure including a reflective film or a semi-transmissive film formed of any of the above-described materials, and a transparent conductive film formed of indium tin oxide (ITO), indium zinc oxide (IZO), zinc oxide (ZnO), indium tin zinc oxide (ITZO), and/or the like. For example, the first electrode EU may be a multilayer metal film, and may have a structure in which metal films of ITO/Ag/ITO are stacked. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include a hole injection layer HIL and a hole transport layer HTL. In one or more embodiments, the hole transport region HTR may further include at least one of a hole buffer layer or an electron blocking layer, in addition to the hole injection layer HIL and the hole transport layer HTL. The hole buffer layer may increase light emission efficiency by compensating for a resonance distance according to the wavelength of light emitted from the light-emitting layer EML. A material that may be included in the hole transport region HTR may be used as a material included in the hole buffer layer. The electron blocking layer is a layer that prevents or reduces the injection of electrons from the electron transport region ETR to the hole transport region HTR.

The hole transport region HTR may have a single layer formed of a single material, a single layer formed of a plurality of different materials, or a multilayer structure having a plurality of layers formed of a plurality of different materials. For example, the hole transport region HTR may have a structure of a single layer formed of a plurality of different materials, or may have a structure such as hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, in which the layers are sequentially stacked from the first electrode EL1, but one or more embodiments of the present disclosure are not limited thereto.

The hole transport region HTR may be formed using one or more suitable methods such as a vacuum evaporation method, a spin coating method, a cast method, a Langmuir-Blodgett (LB) method, an inkjet printing method, a laser printing method, and/or a laser induced thermal imaging (LITI).

The hole injection layer HIL may include, for example, phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4'4''-tris(N,N-diphenylamino)triphenylamine (TDATA), 4,4',4''-tris{N,-(2-naphthyl)-N-phenylamino}-triphenylamine (2-TNATA), poly(3,4-ethylenedioxythiophene)/poly(4-styrenesulfonate) (PEDOT/PSS), Polyaniline/Dodecylbenzenesulfonic acid (PANI/DBSA), Polyaniline/Camphor sulfonicacid (PANI/CSA), (polyaniline)/poly(4-styrenesulfonate) (PANI/PSS), N,N'-di(naphthalene-1-yl)-N,N'-diphenyl-benzidine (NPB), polyetherketone containing triphenylamine (TPAPEK), 4-isopropyl-4'-methyldiphenyliodonium tetrakis(pentafluorophenyl) borate], dipyrazino[2,3-f: 2',3'-h] quinoxaline-2,3,6,7,10,11-hexacarbonitrile (HAT-CN), and/or the like.

The hole transport layer HTL may include, for example, carbazole-based derivative (such as N-phenylcarbazole and/ or polyvinylcarbazole), fluorine-based derivatives, triphenylamine-based derivatives (such as NN-bis(3-methylphenyl)-N,N'-diphenyl-[1,1-biphenyl]-4,4'-diamine (TPD), 4,4', 4'''-tris(N-carbazolyl)triphenylamine (TCTA)), N,N'-di (naphthalene-1-yl)-N,N'-diphenyl-benzidine (NPB), 4,4'-cyclohexylidene bis[N,N-bis(4-methylphenyl) benzenamine] (TAPC), 4,4'-bis[N,N-(3-tolyl)amino]-3,3'-dimethylbiphenyl (HMTPD), 1,3-Bis(N-carbazolyl)benzene (mCP), and/or the like.

A light-emitting layer EML is provided on the hole transport region HTR. In the light-emitting element ED according to one or more embodiments, the light-emitting layer EML may be formed from the quantum dot composition of one or more embodiments. The light-emitting layer includes a plurality of quantum dot complex QD-C. The quantum dot complex QD-C included in the light-emitting layer EML may bind to two or more other quantum dot complex QD-C. The quantum dot complex QD-C means a composite in which two different kinds of ligands bind to the surface of the quantum dot QD, and the quantum dot complex QD-C will be described in more detail with reference to FIGS. 7 and 8.

In the light-emitting element ED according to one or more embodiments, the light-emitting layer EML may include a host and a dopant. In one or more embodiments, the light-emitting layer EML may include a quantum dot complex QD-C as a dopant material. In one or more embodiments, the light-emitting layer EML may further include a host material. In the light-emitting element ED according to one or more embodiments, the light-emitting layer EML may emit fluorescence. For example, the quantum dot complex QD-C may be used as a fluorescent dopant material.

The light-emitting layer EML may have a thickness of, for example, about 5 nm to about 20 nm, or about 10 nm to about 20 nm.

The light-emitting layer EML may be formed using one or more suitable methods such as a vacuum evaporation method, a spin coating method, a cast method, a LB method (Langmuir-Blodgett), an inkjet printing method, a laser printing method, and/or a laser induced thermal imaging (LITI). For example, the light-emitting layer EML may be formed by providing the quantum dot composition of one or more embodiments using an inkjet printing method.

In the light-emitting element ED according to one or more embodiments, the electron transport region ETR is provided on the light-emitting layer EML. The electron transport region ETR may include at least one of a hole blocking layer, an electron transport layer ETL, or an electron injection layer EIL, but one or more embodiments of the present disclosure are not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In one or more embodiments, the electron transport region ETR may have a structure of a single layer formed of a plurality of different materials, or may have a structure such as electron transport layer ETL/ electron injection layer EIL, or hole blocking layer/electron transport layer ETL/electron injection layer EIL, in which the layers are sequentially stacked from the light-emitting layer EML, but one or more embodiments of the present disclosure are not limited thereto. The thickness of the electron transport region ETR may be, for example, about 200 Å to about 1,500 Å.

The electron transport region ETR may be formed using one or more suitable methods such as a vacuum evaporation method, a spin coating method, a cast method, a LB method (Langmuir-Blodgett), an inkjet printing method, a laser printing method, and/or a laser induced thermal imaging (LITI).

The electron transport region ETR may include an anthracene-based compound. However, the present disclosure is not limited thereto, and the electron transport region may include, for example, tris(8-hydroxyquinolinato)aluminum (Alq3), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1'-biphenyl-4-olato)aluminum (BAlq), berylliumbis(benzoquinolin-10-olate (Bebq$_2$), 9,10-di(naphthalene-2-yl) anthracene (ADN), and/or a mixture thereof. The thickness of the electron transport layer ETL may be about 100 Å to about 1,000 Å, for example, about 150 Å to about 500 Å. When the thickness of the electron transport layer ETL satisfies any of the above-described ranges, a satisfactory (or suitable) electron transport characteristic may be obtained without a substantial increase in driving voltage.

When the electron transport region ETR includes the electron injection layer EIL, the electron transport region ETR may include metal halide, lanthanum group metal, co-deposition material of metal halide and lanthanum group metal, and/or the like. In one or more embodiments, the metal halide may be an alkali metal halide. For example, the electron transport region ETR may include LiF, Liq(Lithium quinolate), $Li_2O$, BaO, NaCl, CsF, Yb, RbCl, RbI, KI, KI:Yb, and/or the like, but one or more embodiments of the present disclosure are not limited thereto. In one or more embodiments, the electron injection layer EIL may be formed of a material in which an electron transport material and an insulating organometallic salt are mixed. For example, the organometallic salt may include metal acetate, metal benzoate, metal acetoacetate, metal acetylacetonate, and/or metal stearate. The thickness of the electron injection layer EIL may be about 1 Å to about 100 Å, for example, about 3 Å to about 90 Å. When the thickness of the electron injection layer EIL satisfies any of the above-described ranges, a satisfactory (or suitable) electron injection characteristic may be obtained without a substantial increase in driving voltage.

As mentioned above, the electron transport region ETR may include the hole blocking layer. The hole blocking layer may include, for example, at least one of BCP(2,9-dimethyl-4,7-diphenyl-1,10-phenanthroline) or Bphen(4,7-diphenyl-1,10-phenanthroline), but one or more embodiments of the present disclosure are not limited thereto.

The second electrode EL2 is provided on the electron transport region ETR. The second electrode EL2 may be a common electrode and/or a negative electrode. The second electrode EL2 may be a transmissive electrode, a transflective electrode, or a reflective electrode. When the second electrode EL2 is the transmissive electrode, the first electrode EL1 may include a transparent metal oxide such as indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb W, a compound thereof (e.g., AgYb, AgMg, MgAg compounds and/or the like, depending on the content) and/or a mixture thereof (e.g., a mixture of Ag and Mg, a mixture of Ag and Yb, and/or the like). In one or more embodiments, the second electrode EL2 may have a multilayer structure including a reflective film or a semi-transmissive film formed of any of the above-described materials and a transparent conductive film formed of indium tin oxide (ITO), indium zinc oxide (IZO), zinc oxide (ZnO), indium tin zinc oxide (ITZO), and/or the like.

In one or more embodiments, the second electrode EL2 may be connected (e.g., electrically coupled) to an auxiliary electrode. When the second electrode EL2 is connected (e.g., electrically coupled) to the auxiliary electrode, the resistance of the second electrode EL2 may be reduced.

Figure 5:
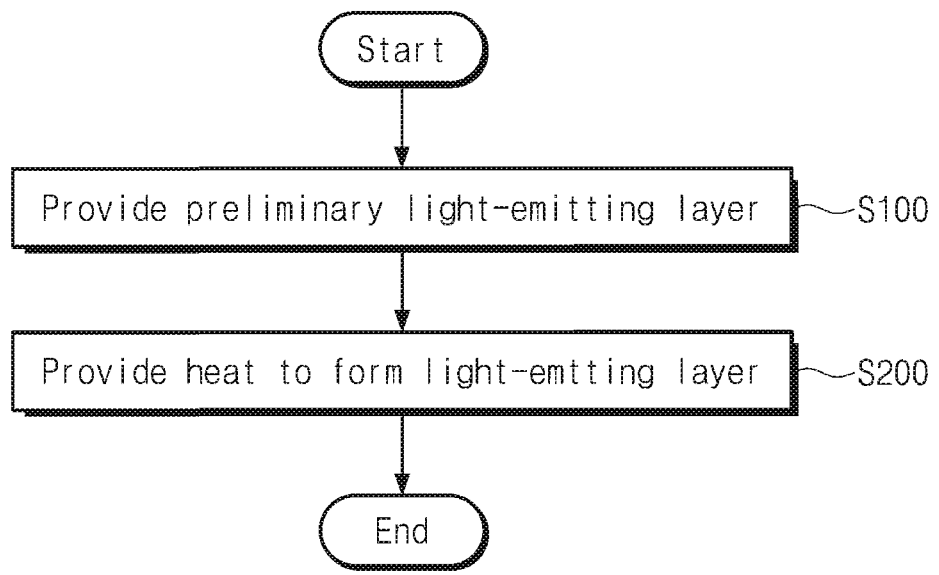
FIG. 5 is a flowchart illustrating a method of manufacturing a light-emitting element according to one or more embodiments.
Figure 6:
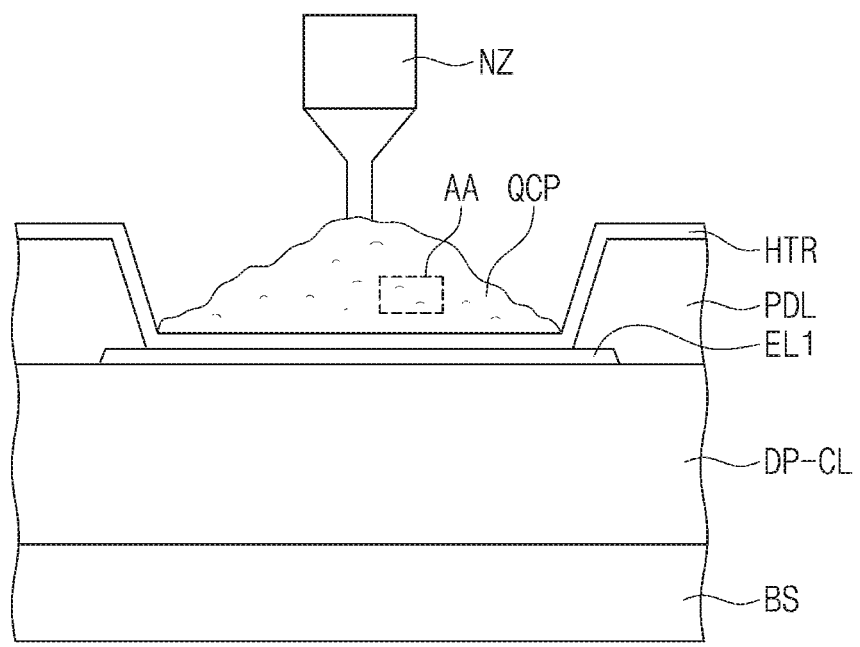
FIG. 6 is a cross-sectional view schematically illustrating forming of a preliminary light-emitting layer in a method of manufacturing a light-emitting element according to one or more embodiments.
Figure 7:
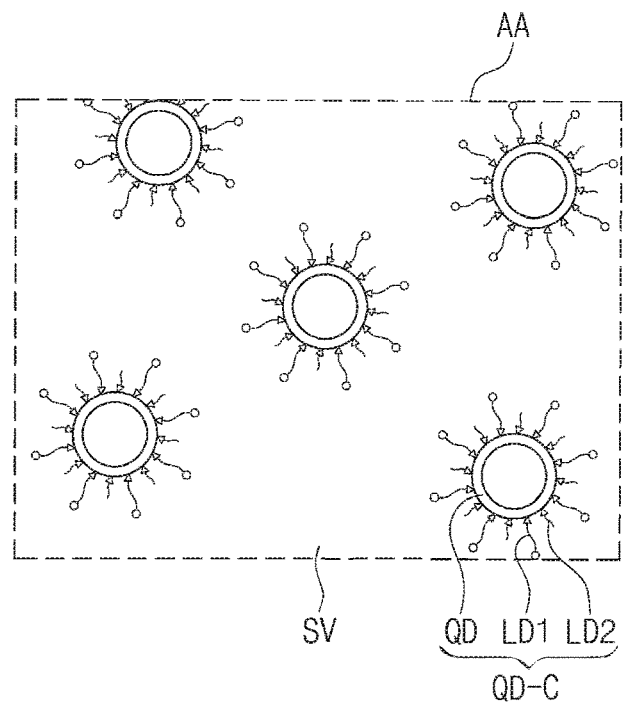
FIG. 7 is a cross-sectional view illustrating a part of the quantum dot composition illustrated in FIG. 6 in more detail.
Figure 8:
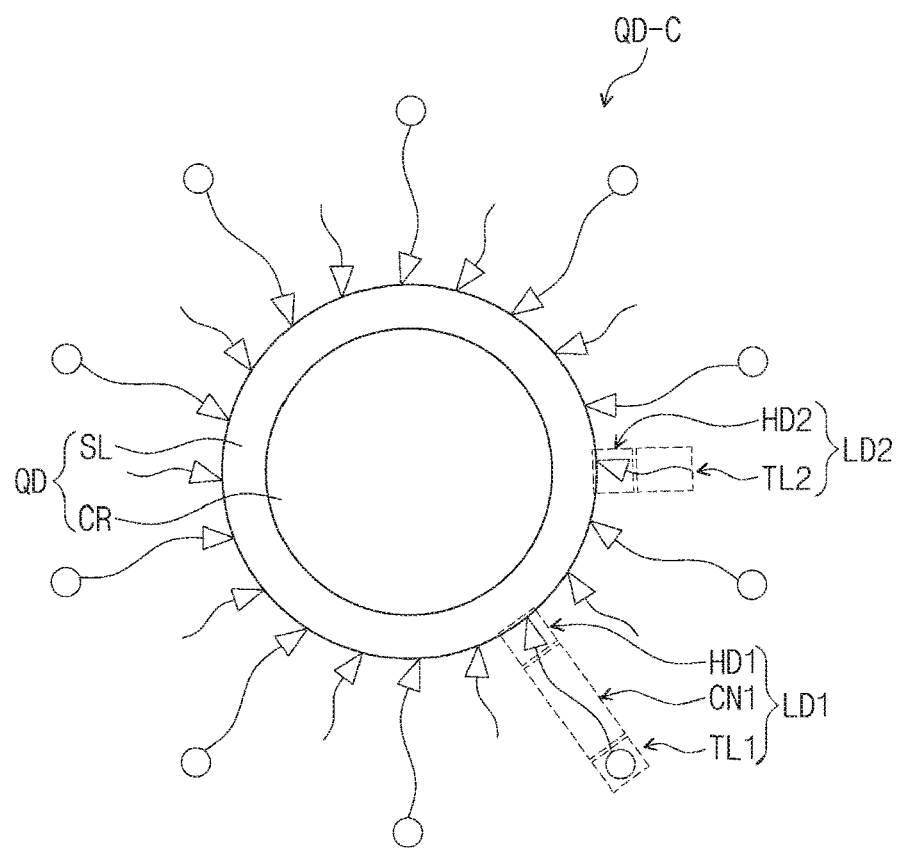
FIG. 8 is a schematic diagram of a quantum dot composite according to one or more embodiments.

FIG. 5 is a flowchart illustrating a method of manufacturing a light-emitting element according to one or more embodiments. FIG. 6 schematically illustrates providing a preliminary light-emitting layer (S100) in a method of manufacturing a light-emitting element according to one or more embodiments. FIG. 7 illustrates in more detail a part ("AA" region) of the quantum dot composition QCP illustrated in FIG. 6. FIG. 8 schematically illustrates a quantum dot complex QD-C according to one or more embodiments.

A method of manufacturing a light-emitting element according to one or more embodiments may include providing of a preliminary light-emitting layer (S100) and providing of heat to form a light-emitting layer (S200).

Providing of the preliminary light-emitting layer (S100) may include providing a quantum dot composition QCP onto the hole transport region HTR. The quantum dot composition QCP may be provided between portions of the pixel defining layer PDL through the nozzle NZ. Although FIG. 6 illustrates that the hole transport region HTR is provided as a common layer so as to overlap the pixel defining layer PDL, one or more embodiments of the present disclosure are not limited thereto. The hole transport region HTR may be provided between portions of the pixel defining layer PDL. For example, the hole transport region HTR may be provided between portions of the pixel defining layer PDL using an inkjet printing method.

Referring to FIG. 7, the quantum dot composition QCP of one or more embodiments may include a quantum dot QD, and a first ligand LD1 and a second ligand LD2 that are distinct from each other and bind to the surface of the quantum dot QD. Hereinafter, a state in which the first ligand LD1 and the second ligand LD2 bind to the surface of the quantum dot QD will be described as a quantum dot complex QD-C. The quantum dot complex QD-C is a composite in which the first ligand LD1 and the second ligand LD2 are bonded to the surface of the quantum dot QD, and may have improved dispersibility and capping characteristics while maintaining charge injection characteristics. In addition, it is possible to prevent or reduce direct contact between the material of the adjacent layer (for example, the hole transport region HTR and the electron transport region ETR) and the quantum dot QD, so that the quenching of the quantum dot QD can be reduced.

In one or more embodiments, the quantum dot composition QCP may further include an organic solvent SV. For example, the organic solvent SV may include hexane, toluene, chloroform, dimethyl sulfoxide, dimethyl formamide, and/or the like. However, one or more embodiments of the present disclosure are not limited thereto.

To form the light-emitting layer EML, the quantum dot complex QD-C may be provided while being dispersed in an organic solvent SV. The dispersibility of the quantum dot QD in the organic solvent SV may be increased as the ligands LD1 and LD2 bind to the surface of the quantum dot QD. The method of forming the light-emitting layer may further include evaporating the organic solvent SV after the providing of the quantum dot composition QCP.

Referring to FIG. 8, the quantum dot QD may include a core CR and a shell SL surrounding (or around) the core CR. However, one or more embodiments of the present disclosure are not limited thereto, and the quantum dot QD may have a single layer structure formed of only the core CR. The shell SL of the quantum dot QD having a core-shell structure may serve as a protective layer to maintain semiconductor characteristics by preventing or reducing chemical modification of the core CR, and/or serve as a charging layer to impart electrophoretic characteristics to the quantum dot QD. The shell SL may be a single layer or multiple layers. The interface between the core CR and the shell SL may have a concentration gradient in which the concentration of an element present in the shell SL decreases toward the center.

The quantum dot QD of one or more embodiments may be a semiconductor nanocrystal that may be selected from among a group II-VI compound, a group III-V compound, a group IV-VI compound, a group IV element, a group IV compound, and a combination thereof.

The group II-VI compound may be selected from the group consisting of a binary compound selected from the group consisting of CdSe, CdTe, ZnS, ZnSe, ZnTe, ZnO, HgS, HgSe, HgTe, MgSe, MgS and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe and a mixture thereof.

The group III-VI compound may include a binary compound such as $In_2S_3$ and/or $In_2Se_3$; a ternary compound such as $InGaS_3$ and/or $InGaSe_3$, or any combination thereof.

The group III-V compound may be selected from the group consisting of a binary compound selected from the group consisting of GaN, GaP, GaAs, GaSb, AlN, AlP, AlAs, AlSb, InN, InP, InAs, InSb and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof. The group III-V semiconductor compound may further include a group II metal (e.g., InZnP, and/or the like)

The group IV-VI compound may be selected from the group consisting of a binary compound selected from the group consisting of SnS, SnSe, SnTe, PbS, PbSe, PbTe and a mixture thereof; a ternary compound selected from the group consisting of SnSeS, SnSeTe, SnSTe, PbSeS, PbSeTe, PbSTe, SnPbS, SnPbSe, SnPbTe and a mixture thereof; and a quaternary compound selected from the group consisting of SnPbSSe, SnPbSeTe, SnPbSTe and a mixture thereof. The group IV element may be selected from the group consisting of Si, Ge, and a mixture thereof. The group IV compound may be a binary compound selected from the group consisting of SiC, SiGe, and a mixture thereof.

The group I-III-VI semiconductor compound may include a ternary compound such as AgInS, $AgInS_2$, CuInS, $CuInS_2$, $CuGaO_2$, $AgGaO_2$, and/or $AgAlO_2$, or any combination thereof.

In this case, the binary compound, the ternary compound, and/or the quaternary compound may be present in the particle with a uniform concentration, or may be present in the same particle with partially different concentrations. In addition, one quantum dot may have a core/shell structure surrounding (e.g., around) another quantum dot. The interface between the core and the shell may have a concentration gradient in which the concentration of an element present in the shell decreases toward the center.

In the quantum dot QD of one or more embodiments, the shell SL may be formed of a metal oxide, a non-metal oxide, a semiconductor compound, or a combination thereof. For example, examples of the metal oxide and the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and a ternary compound such as $MgAl_2O_4$, $CoFe_2O_4$, $NiFe_2O_4$, and/or $CoMn_2O_4$, but one or more embodiments of the present disclosure are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InGaP, InSb, AlAs, AlP, AlSb and the like, but one or more embodiments of the present disclosure are not limited thereto.

The quantum dot QD may have a full width of half maximum (FWHM) of an emission wavelength spectrum of about 45 nm or less, for example, about 40 nm or less, or about 30 nm or less, and in any of these ranges, the color purity and/or the color reproducibility may be improved. In addition, light emitted through these quantum dots is emitted in all directions, so that wide viewing angle characteristics may be improved.

In one or more embodiments, the shape of the quantum dot QD is not particularly limited and may be any suitable shape in the art. For example, the quantum dot QD may have a shape such as a spherical shape, a pyramidal shape, a multi-arm shape, and/or a cubic nanoparticle, a nanotube, a nanowire, a nanofiber, and/or a nanoplatelet particle.

The quantum dot QD may control the color of light emitted according to the particle size, and accordingly, the quantum dot QD may have various emission colors such as blue, red, and/or green. The quantum dot may emit light in a shorter wavelength range as the particle size of the quantum dot QD gets smaller. For example, in the quantum dot QD having the same core, the particle size of the quantum dot that emits green light may be smaller than the particle size of the quantum dot that emits red light. In the quantum dot QD having the same core, the particle size of the quantum dot that emits blue light may be smaller than the particle size of the quantum dot that emits green light. However, one or more embodiments of the present disclosure are not limited thereto, and the particle size may be adjusted according to a shell forming material and a shell thickness even in the quantum dot QD having the same core.

In one or more embodiments, when the quantum dots QD have various emission colors such as blue, red, and/or green, the quantum dots QD having different emission colors may have different core materials.

The quantum dot complex QD-C according to one or more embodiments includes a first ligand LD1 that binds to the surface of the quantum dot QD. The first ligand LD1 includes a first head portion HD1 that binds to the surface of the quantum dot QD, and a first tail portion TL1 exposed to the outside. The first ligand LD1 may further include a chain portion CN1 connecting (e.g., coupling) the first head portion HD1 and the first tail portion TL1.

The first head portion HD1 of the first ligand LD1 is a portion that binds to the surface of the quantum dot QD, and may include a functional group, for example, a hydrophilic group, for binding to the surface of the quantum dot QD. For example, the first head portion HD1 may include a thiol group, a dithioic acid group, a phosphine group, a catechol group, an amine group, and/or a carboxylic acid group. When the first head portion HD1 includes one functional group to bind to the surface of the quantum dot QD, the first ligand LD1 may be a monodentate ligand. When the first head portion HD1 includes two functional groups to bind to the surface of the quantum dot QD, the first ligand LD1 may be a bidentate ligand. The first head portion HD1 includes a functional group for binding (e.g., to bind) to the surface of the shell SL of the quantum dot QD, so that the first ligand LD1 may effectively (or suitably) bind to the quantum dot QD.

The first tail portion TL1 of the first ligand LD1 is a portion capable of binding to a first ligand that binds to another quantum dot, and that includes a crosslinkable functional group at the terminal of the first ligand. The crosslinkable functional group is not particularly limited as long as the crosslinkable functional group may form a bond with another functional group. For example, the crosslinkable functional group may be a thermal crosslinkable functional group or a photocrosslinkable functional group. In one or more embodiments, the crosslinkable functional group may be a vinyl group, a hydroxy group, a carboxyl group, an epoxy group, an amide group, an amine group, an azide group, an oxetanyl group, and/or an isocyanate group.

The chain portion CN1 of the first ligand LD1 may perform a function of connecting the first head portion HD1 and the first tail portion TL1, and controlling the degree of dispersion of the quantum dot complex QD-C in the quantum dot composition QCP by adjusting the length of the first ligand LD1. The chain portion CN1 may contain 2 to 20 carbons. For example, the chain portion CN1 may include an alkyl group having 2 or more carbon atoms and an alkyl group having 1 or more carbon atoms, or may include an alkyl group having 3 or more carbon atoms. When the number of carbons in the chain portion CN1 is less than 2, the distance between the quantum dots QD may be too short; and when the number of carbons exceeds 20, the distance between the quantum dots QD may become too long. The chain portion CN1 may further include a functional group in order to control the solubility of the quantum dot complex QD-C and/or prevent or reduce oxidation of the quantum dot complex QD-C, and may further include, for example, an amine group, an oxy group, a thio group, an ester group, an ether group, an aryl group, and/or an amide group.

In one or more embodiments, the chain portion CN1 may be omitted, and the first head portion HD1 and the first tail portion TL1 of the first ligand LD1 may be directly connected.

In one or more embodiments, the first ligand LD1 may be represented by the following Formula A or Formula B:

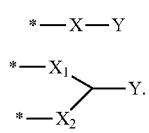

[Formula A]
[Formula B]

In Formulae A and B, *- is a position to which the quantum dot binds. In Formulae A and B, X, $X_1$, and $X_2$ may each independently be S or NRi, and Ri may be a hydrogen atom or an alkyl group having 1 to 3 carbon atoms.

In Formulae A and B, Y may be represented by any one of the following Formulae 1 to 7. However, one or more embodiments of the present disclosure are not limited thereto:

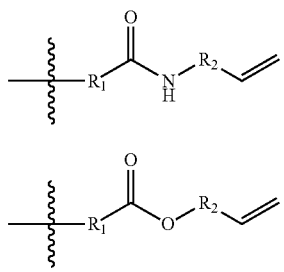

[Formula 1]

[Formula 2]

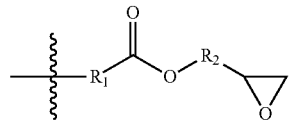

[Formula 3]

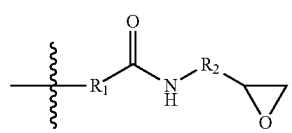

[Formula 4]

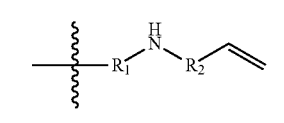

[Formula 5]

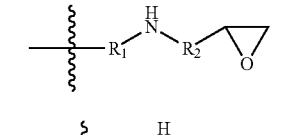

[Formula 6]

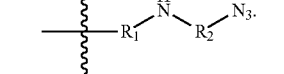

[Formula 7]

In Formulae 1 to 7, $R_1$ may be an alkyl group having 2 to 20 carbon atoms, and $R_2$ may be an alkyl group having 1 to 20 carbon atoms. However, the sum of the number of carbon atoms of $R_1$ and $R_2$ is 20 or less. In one or more embodiments, in Formulae 1 to 7,

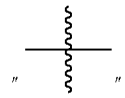

means a position connected (e.g., a binding site) to the X, $X_1$ or $X_2$.

The quantum dot complex QD-C according to one or more embodiments includes a second ligand LD2 that binds to the surface of the quantum dot QD. When the second ligand LD2 is applied to the light-emitting layer EML, the second ligand LD2 may improve the mobility of electric charges. The second ligand LD2 has a smaller length than the first ligand LD1. The length of the ligands LD1 and LD2 may mean the greatest length among the total lengths of the portions constituting each of the ligands LD1 and LD2. The second ligand LD2 includes a second head portion HD2 that binds to the surface of the quantum dot QD, and a second tail portion TL2 that is exposed to the outside.

The second head portion HD2 of the second ligand LD2 is a portion that binds to the surface of the quantum dot QD, and may include a functional group for binding to the surface of the quantum dot QD. The description of the first head portion HD1 may be similarly applied to the second head portion HD2, and the second head portion HD2 may have the same functional group as the first head portion HD1.

The second tail portion TL2 of the second ligand LD2 may include a functional group capable of adjusting a charge mobility (e.g., capable of controlling charge transfer). The functional group capable of controlling charge transfer may be, for example, any one selected from among a substituted or unsubstituted alkyl group having a length of about 1.5 nm or less, a substituted or unsubstituted alkenyl group having a length of about 1.5 nm or less, a substituted or unsubstituted carbazolyl group, a triazinyl group, a pyrenyl group, an electron-withdrawing group, an electron-donating group, a polyethylenimine moiety, and an ethoxylated polyethylenimine moiety, but one or more embodiments of the present disclosure are not limited thereto.

The electron-withdrawing group may be a nitro group, a thioamide group, an amide group, a fluorine group, a cyano group, an ester group, and/or a carbonyl group, but one or more embodiments of the present disclosure are not limited thereto. The electron-donating group may be an aryl group having 6 to 20 ring-forming carbon atoms, an amine group, an alkoxy group, and/or a thioether group, but one or more embodiments of the present disclosure are not limited thereto.

In one or more embodiments, the second ligand LD2 may be represented by any one of Formulae 8 to 15 below:

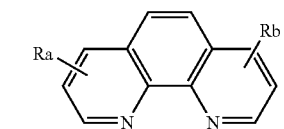

[Formula 8]

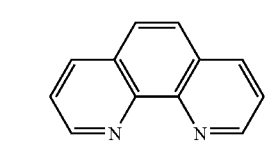

[Formula 9]

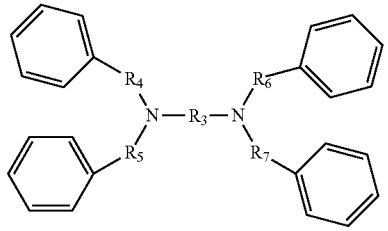

[Formula 10]

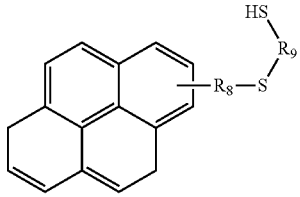

[Formula 11]

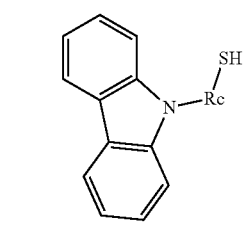

[Formula 12]

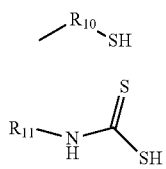

[Formula 13]

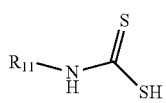

[Formula 14]

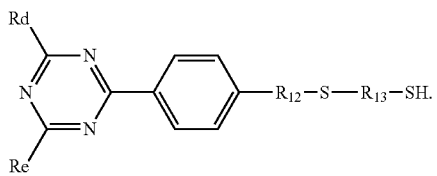

[Formula 15]

In Formulae 8 to 15, Ra to Re may be each independently an alkyl group having 1 to 3 carbon atoms or an aryl group having 6 to 12 ring-forming carbon atoms.

In Formulae 8 to 15, $R_1$ to $R_9$, and $R_{12}$ and $R_{13}$ may each independently be a direct bond or an alkyl group having 1 to 3 carbon atoms, and $R_{10}$ and $R_{11}$ may each independently be an alkyl group having 3 to 8 carbon atoms.

In one or more embodiments, in the present specification, the alkyl group may be straight, branched or cyclic. Examples of the alkyl group may include a methyl group, an ethyl group, an n-propyl group, a isopropyl group, an n-butyl group, a s-butyl group, a t-butyl group, an i-butyl group, an 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, an 2-ethylpentyl group, a 4-methyl-2-pentyl group, an n-hexyl group, a 1-methylhexyl group, an 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, an 2-ethylheptyl group, a 2-butylheptyl group, an n-octyl group, a t-octyl group, an 2-ethyloctyl group, a 2-butyloctyl group, an 2-hexyloctyl group a 3,7-dimethyloctyl group, a cyclooctyl group, an n-nonyl group, an n-decyl group, an adamantyl group, an 2-ethyldecyl group, a 2-butyldecyl group, a 2-hexyldecyl group, an 2-octyldecyl group, an n-undecyl group, an n-dodecyl group, an 2-ethyldodecyl group, a 2-butyldodecyl group, an 2-hexyldodecyl group, an 2-octyldodecyl group, an n-tridecyl group, an n-tetradecyl group, an n-pentadecyl group, an n-hexadecyl group, an 2-ethylhexadecyl group, a 2-butylhexadecyl group, an 2-hexylhexadecyl group, an 2-octylhexadecyl group, an n-heptadecyl group, an n-octadecyl group, an n-nonadecyl group, an n-icosyl group, an 2-ethylicosyl group, a 2-butylicosyl group, an 2-hexylicosyl group, an 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group and the like, but one or more embodiments of the present disclosure are not limited thereto.

In the present specification, an alkenyl group means a hydrocarbon group including one or more carbon-carbon double bonds in the middle and/or at the terminal of an alkyl group having 2 or more carbon atoms. The alkenyl group may be straight or branched. Examples of the alkenyl group may include a vinyl group, a 1-butenyl group, a 1-pentenyl group, a 1,3-butadienyl aryl group, a styrenyl group, a styryl vinyl group and the like, but one or more embodiments of the present disclosure are not limited thereto.

In the present specification, the aryl group means any functional group or substituent derived from an aromatic hydrocarbon ring. The aryl group may be a monocyclic aryl group or a polycyclic aryl group. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group and the like, but one or more embodiments of the present disclosure are not limited thereto.

Figure 9:
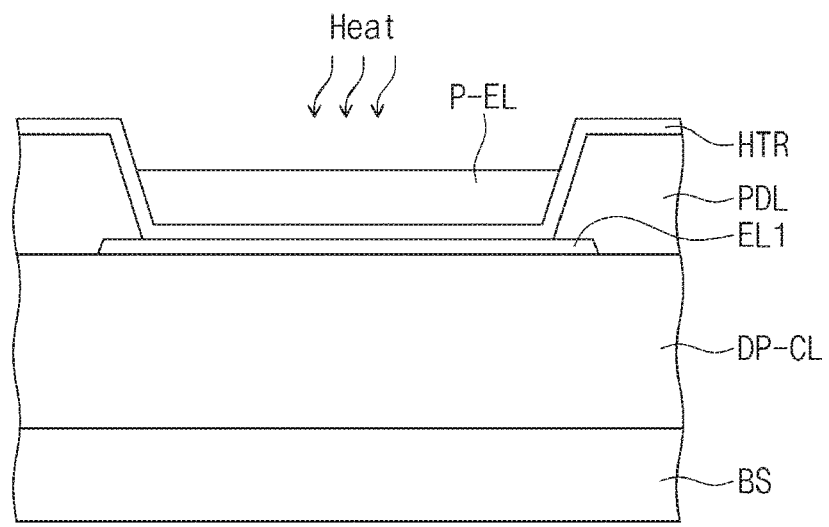
FIG. 9 is a cross-sectional view schematically illustrating (a process or act of) forming of a light-emitting layer in a method of manufacturing a light-emitting element according to one or more embodiments.
Figure 10:
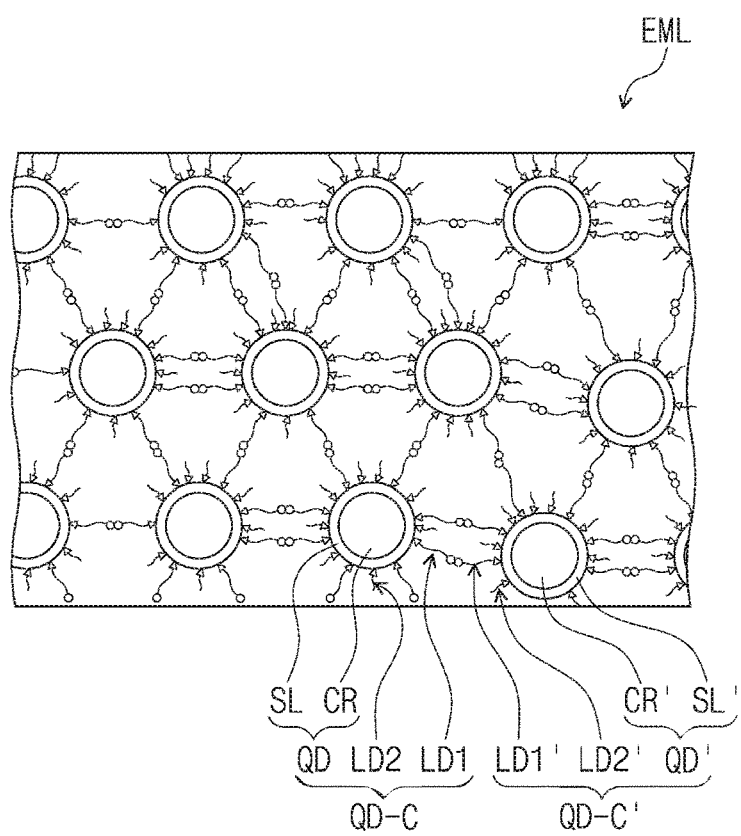
FIG. 10 is a cross-sectional view illustrating a light-emitting layer according to one or more embodiments.
Figure 11:
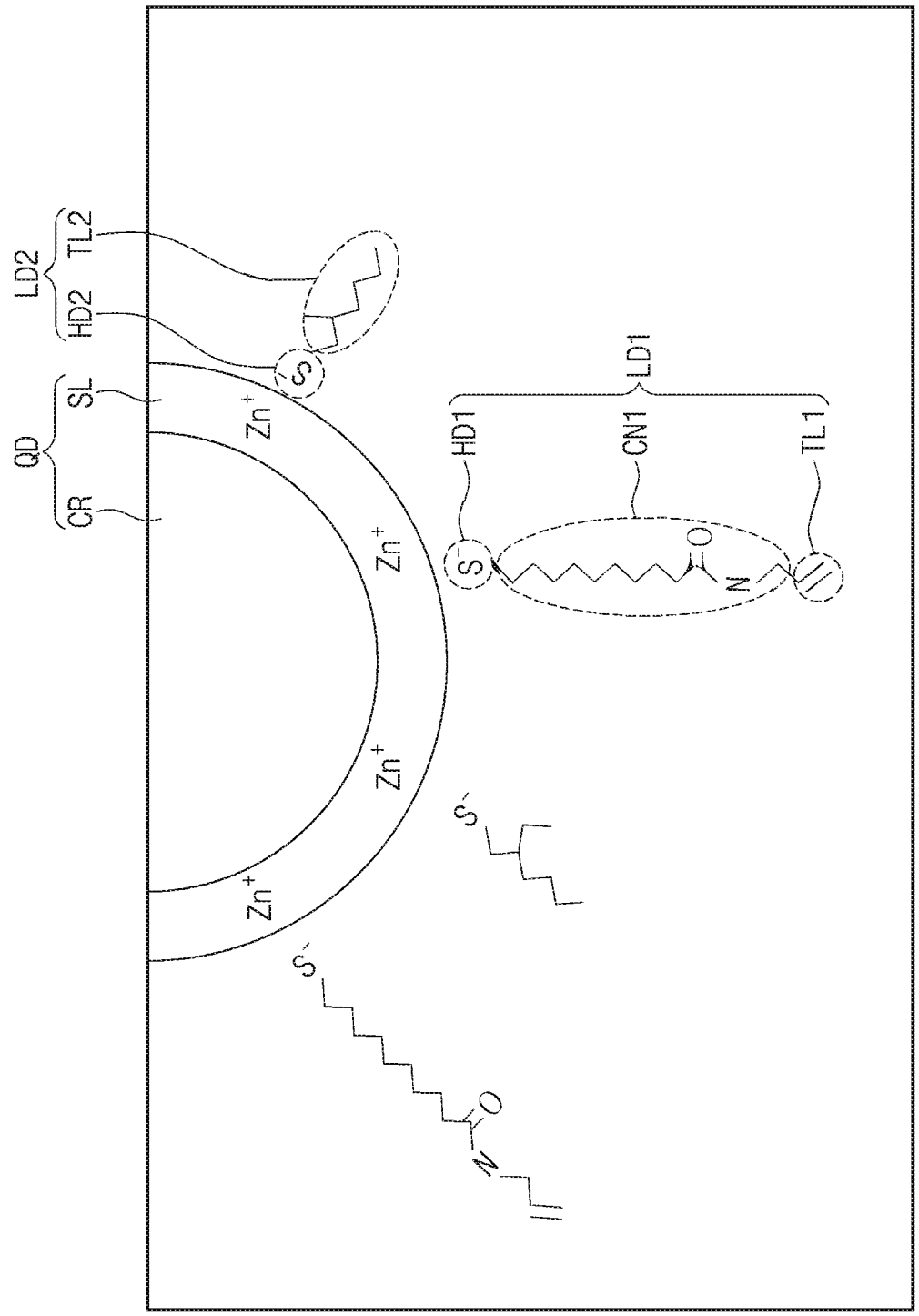
FIG. 11 is a diagram schematically illustrating a quantum dot composition according to one or more embodiments.
Figure 12:
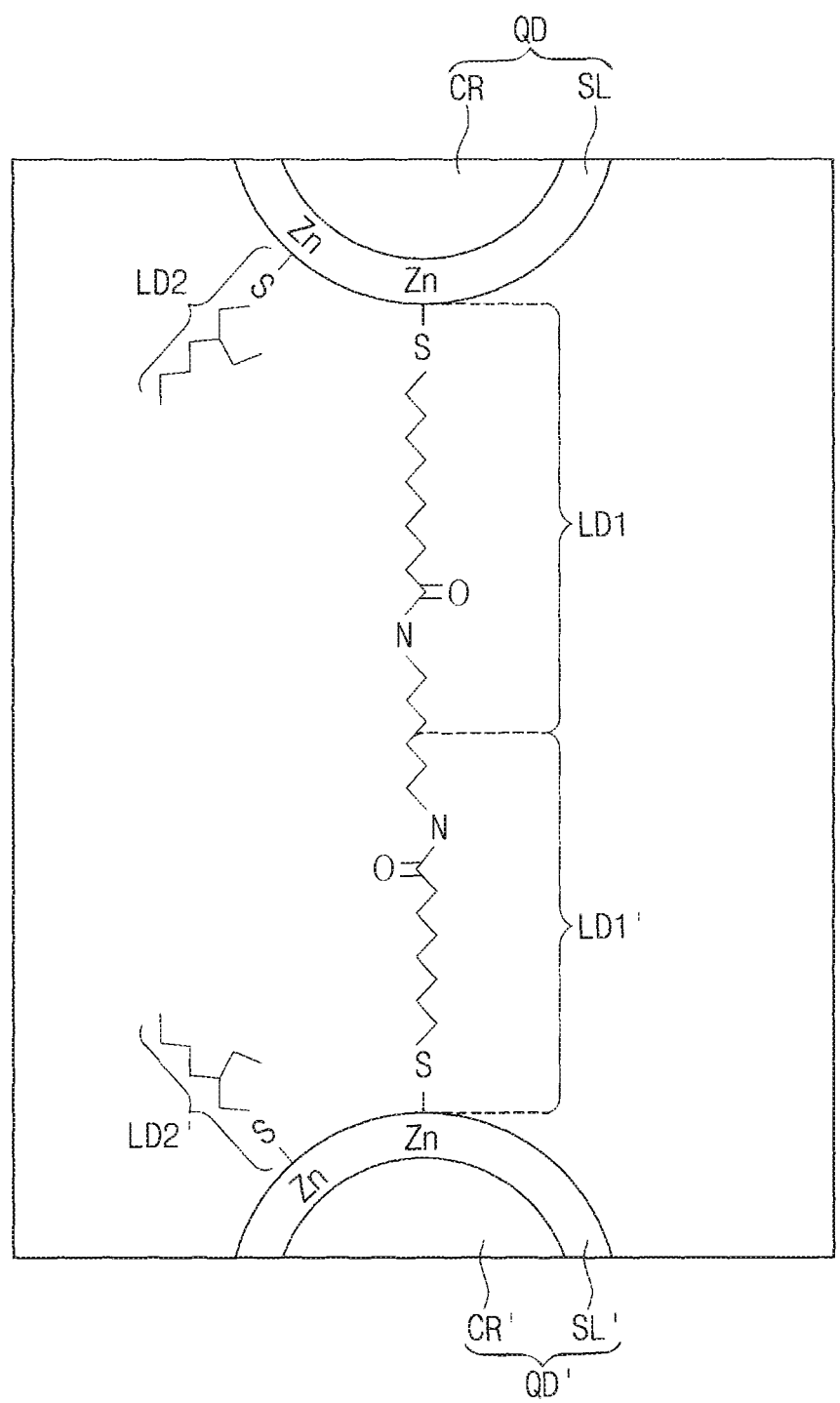
FIG. 12 is a diagram illustrating a reaction between first ligands in the quantum dot composition according to one or more embodiments.

FIG. 9 is a diagram schematically illustrating the formation of a light-emitting layer by providing heat (S200) in a method of manufacturing a light-emitting element, and FIG. 10 is a diagram schematically illustrating a cross section of a light-emitting layer EML thus formed. FIG. 11 illustrates a quantum dot composition according to one or more embodiments, and FIG. 12 illustrates a crosslinking reaction occurring in the quantum dot composition of FIG. 11.

The providing of heat to a preliminary light-emitting layer P-EL according to one or more embodiments may include baking (e.g., heating) the preliminary light-emitting layer P-EL by providing heat of a temperature of about 50° C. or higher, about 70° C. or higher, or about 100° C. or higher to the preliminary light-emitting layer P-EL. The light-emitting layer according to one or more embodiments of the present disclosure may be obtained by inducing bonding between the quantum dot complex QD-C during the baking to form a light-emitting layer, without additionally providing extra heat for bonding between the quantum dot complex QD-C. In addition, the baking may remove an organic solvent SV and/or the like contained in the quantum dot composition QCP.

Referring to FIG. 10, the resulting light-emitting layer EML includes a plurality of quantum dot complexes QD-C and QD-C' connected to each other. When heat is provided to the preliminary light-emitting layer P-EL, a crosslinking reaction occurs between the first ligand LD1 binding (bonded) to the quantum dot QD1 and a first ligand LD1' binding (bonded) to another quantum dot QD', so that the first ligands LD1 and LD1' may form a bond. The tail portion of the first ligand LD1 includes a crosslinkable functional group, and the crosslinkable functional group binds to a crosslinkable functional group of the tail portion of the first ligand LD1' binding to the other quantum dot QD', so that a quantum dot complex QD-C may be in a state of binding (e.g., in a state of being coupled) to another quantum dot complex QD-C'. Quantum dot complex QD-C' may include a core CR' and a shell SL' around the core CR'.

The quantum dot composition QCP according to one or more embodiments of the present disclosure includes a crosslinkable functional group at the end of the first tail portion TL1 of the first ligand LD1 so that the first ligands LD1 and LD1' can effectively (or suitably) bind to each other. Accordingly, the distance between the quantum dots QD and QD' in the light-emitting layer EML may be decreased to increase the stacking density of the quantum dots QD and QD' and reduce voids, thereby improving a luminous efficiency.

In addition, the quantum dot complexes QD-C and QD-C' may include the second ligand LD2 having a relatively smaller length to increase charge mobility between the quantum dot complexes QD-C and QD-C', thereby improving the luminous efficiency.

FIG. 10 illustrates that the quantum dot complexes QD-C, and QD-C' are formed of approximately three layers, but one or more embodiments of the present disclosure are not limited thereto. For example, the arrangement of the quantum dot complex QD-C may vary depending on the thickness of the light-emitting layer EML, the shape of the quantum dot QD included in the light-emitting layer EML, the diameter of the quantum dot QD, and types (e.g., kinds) of the ligands LD1 and LD2. In one or more embodiments, each of the quantum dot complexes in the light-emitting layer may bind to at least two adjacent quantum dot complexes to form one layer, or form a plurality of layers such as two or three layers.

FIGS. 11 and 12 illustrate that the quantum dot complex QD-C includes a first ligand LD1 represented by Formula C below and a second ligand LD2 represented by Formula D below, and the shell SL includes Zn:

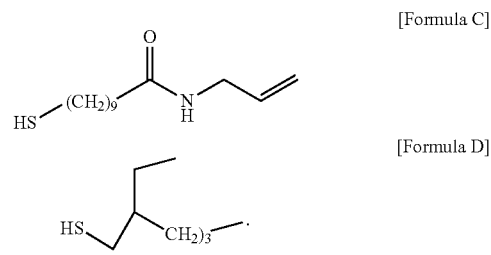

The thiol group of each of the first head portion HD1 and the second head portion HD2 is bonded to Zn, which is a metal ion contained in the shell SL, and each of the ligands LD1 and LD2 effectively (or suitably) binds to the quantum dot QD, so that the quantum dot complex QD-C may be formed. The ligands LD1 and LD2 bind to the quantum dot QD, and thus the quantum dot QD may have excellent dispersibility in an organic solvent in spite of being formed of inorganic particles.

Referring to FIG. 12, during the baking, the quantum dot complexes of FIG. 11 may form a bond through a crosslinking reaction between a vinyl group of the first ligand LD1 binding to the quantum dot QD and a vinyl group of the first ligand LD1' binding to the adjacent quantum dot QD'. For example, the quantum dot complexes may be located close to each other through a crosslinking reaction between the first ligands LD1 and LD1' in the light-emitting layer. In addition, because the second ligand LD2 is relatively short, a space is formed between the second ligand LD2 and another second ligand LD2' adjacent thereto, so that the charge mobility in the light-emitting layer may be improved.

Figure 13A:
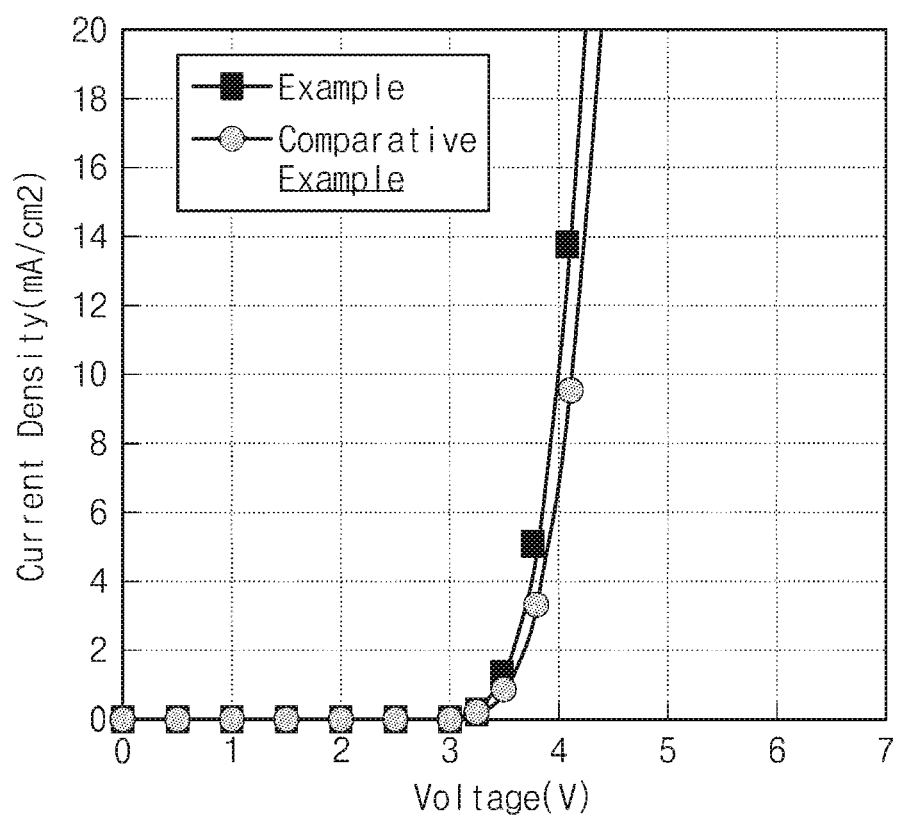
FIGS. 13A and 13B are graphs showing measurements of the characteristics of the light-emitting elements of Examples and Comparative Examples.
Figure 13B:
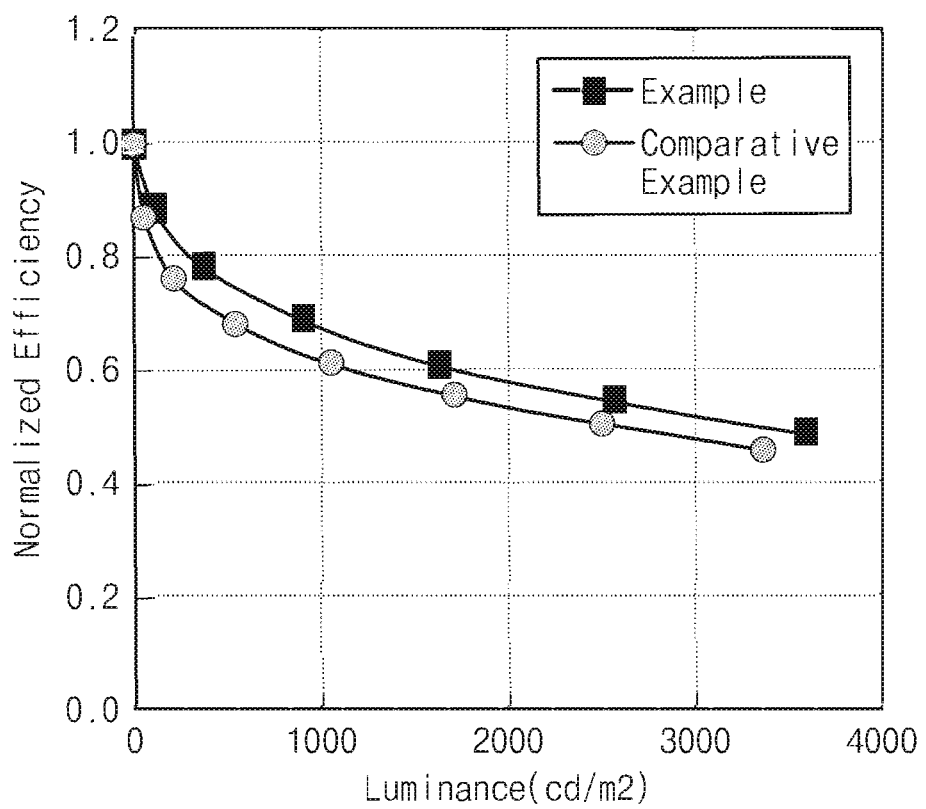

FIGS. 13A and 13B are graphs showing measurements of characteristics of a light-emitting element according to Examples and Comparative Examples. FIG. 13A is a graph obtained by measuring a current density (mA/cm$^2$) versus a voltage of a light-emitting element of Example and a light-emitting element of Comparative Example, and FIG. 13B is a graph obtained by measuring a normalized efficiency versus a luminance (cd/m$^2$) of the light-emitting element of Example and the light-emitting element of Comparative Example.

The light-emitting element of Example has the structure illustrated in FIG. 4, and includes a light-emitting layer formed of the quantum dot composite of FIG. 11. The light-emitting element of Comparative Example is the same as the light-emitting element of Example except that a light-emitting layer is formed of a quantum dot composite akin to the one of FIG. 11 but that does not contain a second ligand. The content of the first ligand of the quantum dot composite included in the light-emitting layer of Example is about 20% of the content of the first ligand of the quantum dot composite of Comparative Example.

Referring to FIGS. 13A and 13B, it may be seen that the light-emitting element formed of a quantum dot composite including a first ligand and a second ligand (Example) has a smaller driving voltage and more improved efficiency than the light-emitting element formed of a quantum dot composite including only the first ligand (Comparative Example).

Figure 14:
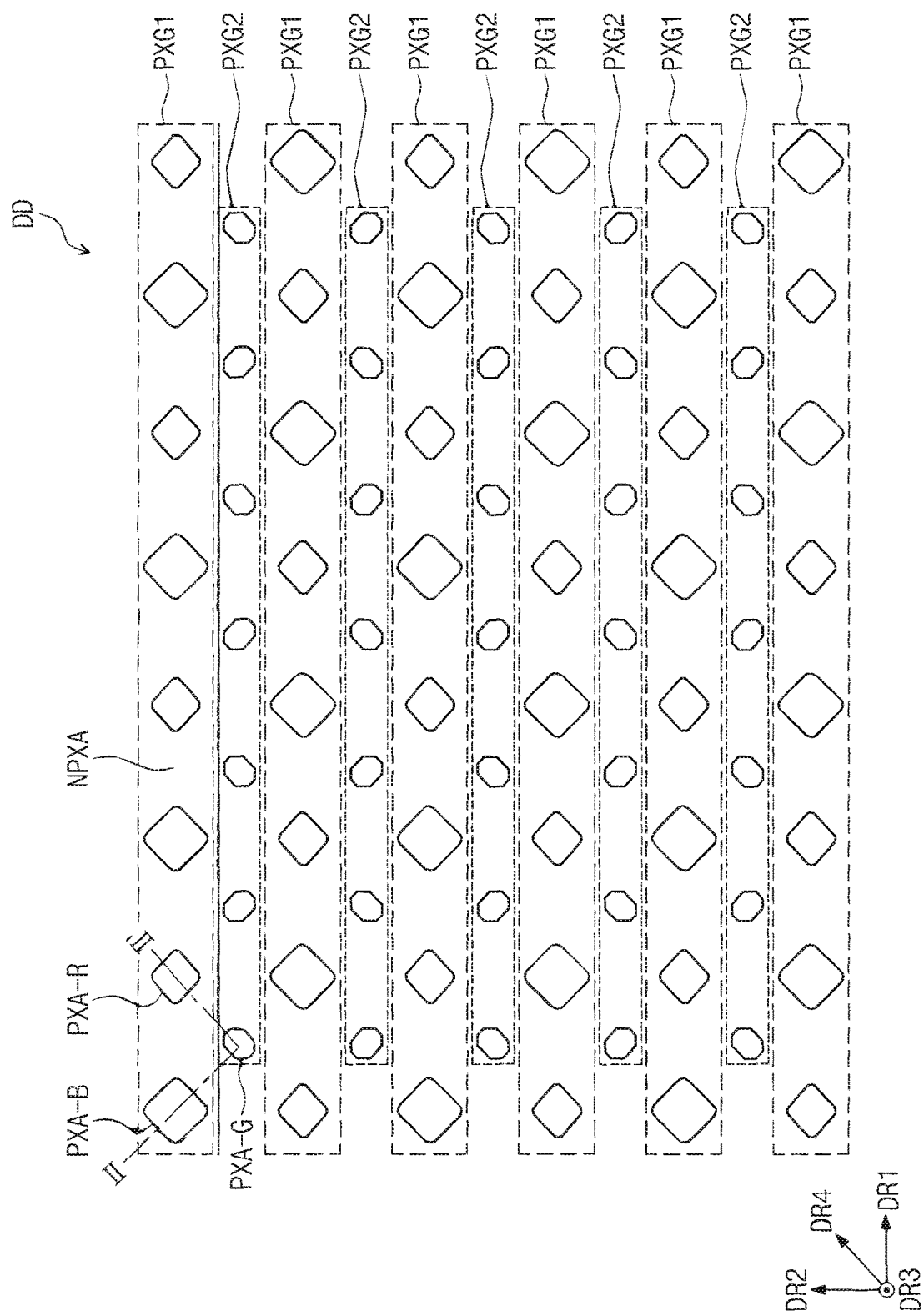
FIG. 14 is a plan view of a display device according to one or more embodiments.
Figure 15:
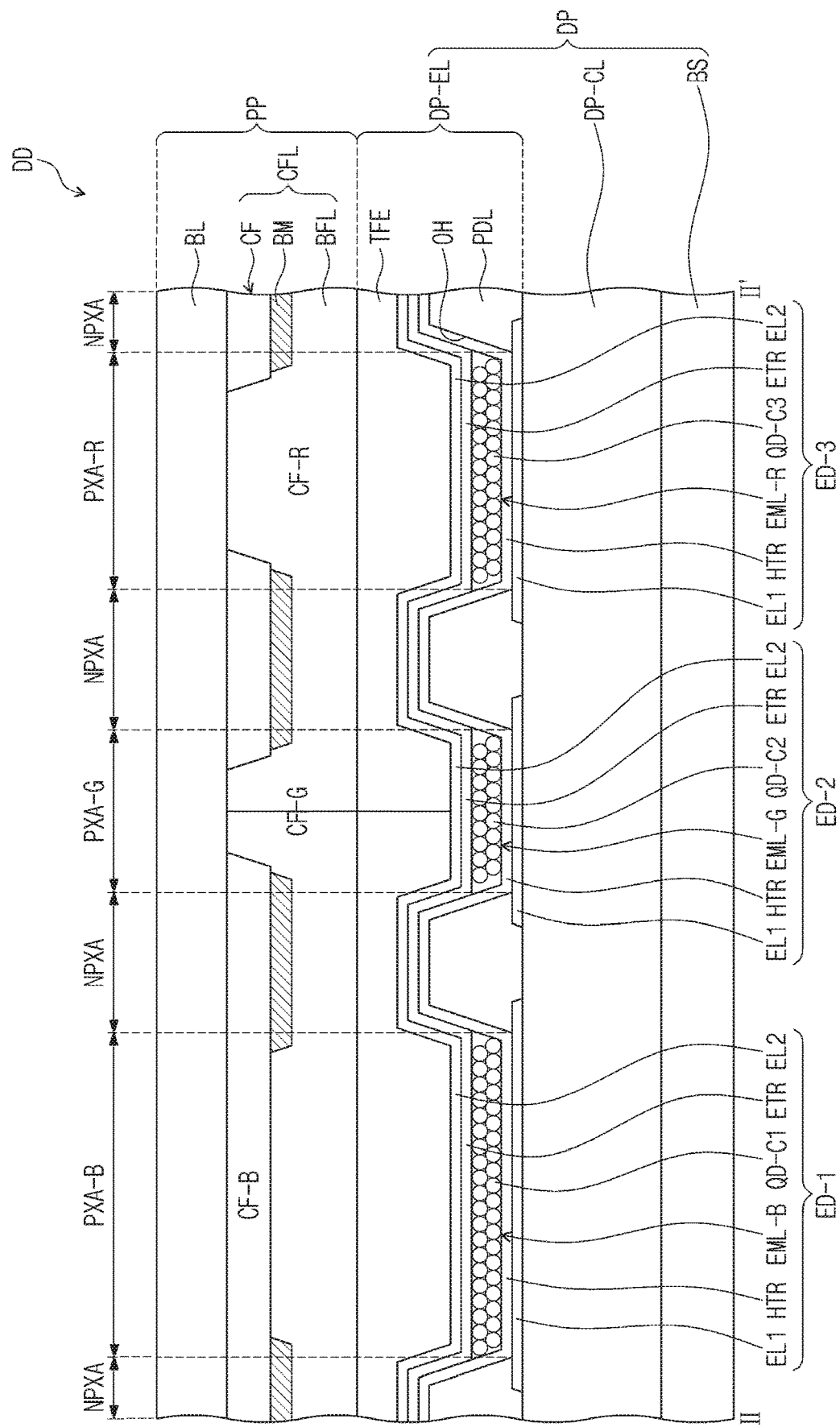
FIG. 15 is a cross-sectional view of a display device according to one or more embodiments taken along line II-II' of FIG. 14.

FIG. 14 is a plan view of a display device DD according to one or more embodiments. FIG. 15 is a cross-sectional view of a display device DD according to one or more embodiments. FIG. 15 is a cross-sectional view taken along line II-II' of FIG. 14.

The display device DD according to one or more embodiments may include a plurality of light-emitting elements ED-1, ED-2, and ED-3, and the light-emitting elements ED-1, ED-2, and ED-3 may respectively include light-emitting layers EML-B, EML-G, and EML-R respectively having quantum dot complexes QD-C1, QD-C2, and QD-C3.

The display device DD according to one or more embodiments may include a display panel DP including a plurality of light-emitting elements ED-1, ED-2, and ED-3 and a light control layer PP disposed on the display panel DP. In one or more embodiments, unlike the configuration illustrated in the drawing, the light control layer PP may be omitted in the display device DD according to one or more embodiments.

The display panel DP may include a base substrate BS, a circuit layer DP-CL and a display element layer DP-EL provided on the base substrate BS. The display element layer DP-EL may have a pixel defining layer PDL, light-emitting elements ED-1, ED-2, and ED-3 disposed between portions of the pixel defining layer PDL, and an encapsulation layer TFE disposed on the light-emitting elements ED-1, ED-2, and ED-3.

Referring to FIGS. 14 and 15, the display device DD may include a non-light-emitting region NPXA and light-emitting regions PXA-B, PXA-G, and PXA-R. The light-emitting regions PXA-B, PXA-G, and PXA-R may be respectively regions in which light generated by the light-emitting elements ED-1, ED-2, and ED-3 is respectively emitted. The light-emitting regions PXA-B, PXA-G, and PXA-R may be spaced apart from each other on a plane (e.g., in plan view).

The light-emitting regions PXA-B, PXA-G, and PXA-R may be divided into a plurality of groups according to the color of light generated from the light-emitting elements ED-1, ED-2, and ED-3. In the display device DD of one or more embodiments illustrated in FIGS. 14 and 15, three light-emitting regions PXA-B, PXA-G, and PXA-R respectively emitting blue light, green light, and red light are illustrated by way of an example. For example, the display device DD according to one or more embodiments may include a blue light-emitting region PXA-B, a green light-emitting region PXA-G, and a red light-emitting region PXA-R that are distinguished from each other.

The plurality of light-emitting elements ED-1, ED-2, and ED-3 may emit light of different wavelength ranges. For example, in one or more embodiments, the display device DD may include a first light-emitting element ED-1 emitting (e.g., to emit) blue light, a second light-emitting element ED-2 emitting (e.g., to emit) green light, and a third light-emitting element ED-3 emitting (e.g., to emit) red light. However, one or more embodiments of the present disclosure are not limited thereto, and the first to third light-emitting elements ED-1, ED-2, and ED-3 may emit light of the same wavelength range or at least one of the first to third light-emitting elements ED-1, ED-2, or ED-3 may emit light of a different wavelength range.

For example, the blue light-emitting region PXA-B, the green light-emitting region PXA-G, and the red light-emitting region PXA-R of the display device DD may respectively correspond to the first light-emitting element ED-1, the second light-emitting element ED-2, and the third light-emitting element ED-3.

The first light-emitting layer EML-B of the first light-emitting element ED-1 may include a first quantum dot complex QD-C1. The first quantum dot complex QD-C1 may emit blue light, which is first light.

The second light-emitting layer EML-G of the second light-emitting element ED-2 and the third light-emitting layer EML-R of the third light-emitting element ED-3 may respectively include a second quantum dot complex QD-C2 and a third quantum dot complex QD-C3. The second quantum dot complex QD-C2 and the third quantum dot complex QD-C3 may respectively emit green light which is second light, and red light which is third light.

Each of the first to third quantum dot complexes QD-C1, QD-C2, and QD-C3 has a quantum dot and a ligand binding to the surface of the quantum dot. For example, the first quantum dot complex QD-C1 may include a first quantum dot and a first ligand, the second quantum dot complex QD-C2 may include a second quantum dot and a second ligand, and the third quantum dot complex QD-C3 may include a third quantum dot and a third ligand. With regard to each of the first to third quantum dot complexes QD-C1, QD-C2, and QD-C3, the description of the quantum dot composite (e.g., the quantum dot complex QD-C) which has been provided in connection with the light-emitting element of the above-described embodiments may be similarly applied.

In one or more embodiments, the first to third quantum dots of the first to third quantum dot complexes QD-C1, QD-C2, and QD-C3 included in the light-emitting elements ED-1, ED-2, and ED-3 may be formed of different core materials. In one or more other embodiments, the first to third quantum dots of the first to third quantum dot complexes QD-C1, QD-C2, and QD-C3 may be formed of the same core material, or two quantum dots selected from among the first to third quantum dots may be formed of the same core material and the rest may be formed of a different core material.

In one or more embodiments, the first to third quantum dots of the first to third quantum dot complexes QD-C1, QD-C2, and QD-C3 may have different diameters. For example, the first quantum dot used in the first light-emitting element ED-1 emitting (e.g., to emit) light in a relatively short wavelength range may have a relatively smaller average diameter than the second quantum dot of the second light-emitting element ED-2 and the third quantum dot of the third light-emitting element ED-3 which respectively emit light in a relatively long wavelength range. However, one or more embodiments of the present disclosure are not limited thereto, and the first to third quantum dots may have similar sizes. In one or more embodiments, the two quantum dots selected from among the first to third quantum dots may have similar (e.g., substantially the same) average diameters and the other may have a different (e.g., substantially different) average diameter.

In one or more embodiments, the first to third ligands of the first to third quantum dot complexes QD-C1, QD-C2, and QD-C3 may be the same as or different from each other. The first to third ligands may be selected according to the emission wavelength of the light-emitting elements ED-1, ED-2, and ED-3 including first to third quantum dot complexes QD-C1, QD-C2, and QD-C3.

In the display device DD of one or more embodiments illustrated in FIGS. 14 and 15, the light-emitting regions PXA-B, PXA-G, and PXA-R may respectively have different areas. In this case, the area may be an area when the light-emitting region is viewed on a plane defined by the first direction DR1 and the second direction DR2 (e.g., in a plan view).

The light-emitting regions PXA-B, PXA-G, and PXA-R may have different areas depending on the colors emitted from the light-emitting layers EML-B, EL-G, and EL-R of the light-emitting elements ED-1, ED-2, and ED-3. For example, referring to FIGS. 14 and 15, in the display device DD of one or more embodiments, the blue light-emitting region PXA-B corresponding to the first light-emitting element ED-1 that emits blue light may have the largest area, and the green light-emitting region corresponding to the second light-emitting element ED-2 that generates green light may have the smallest area. However, one or more embodiments of the present disclosure are not limited thereto, and the light-emitting regions PXA-B, PXA-G, and PXA-R may emit light of a color other than blue light, green light, and/or red light, or the light-emitting regions PXA-B, PXA-G, and PXA-R may have the same area, or light-emitting regions PXA-B, PXA-G, and PXA-R may be provided at a different area ratio than that illustrated in FIG. 14.

Each of the light-emitting regions PXA-R, PXA-G, and PXA-B may be a region divided by a pixel defining layer PDL. The non-light-emitting regions NPXA may be located between the adjacent light-emitting regions PXA-B, PXA-G, and PXA-R and may correspond to the pixel defining layer PDL. In one or more embodiments, in the present specification, each of the light-emitting regions PXA-B, PXA-G, and PXA-R may correspond to a pixel. The pixel defining layer PDL may divide the light-emitting elements ED-1, ED-2, and ED-3. The light-emitting layers of the light-emitting elements ED-1, ED-2, and ED-3 may be divided by being disposed in the openings OH defined in pixel defining layer PDL.

The pixel defining layer PDL may be formed of a polymer resin. For example, the pixel defining layer PDL may be formed of a polyacrylate-based resin or a polyimide-based resin. In addition, the pixel defining layer PDL may be formed by further including an inorganic material in addition to the polymer resin. In one or more embodiments, the pixel defining layer PDL may be formed of a light absorbing material, or may include a black pigment or a black dye. The pixel defining layer PDL formed including a black pigment or black dye may form a black pixel defining layer. When the pixel defining layer PDL is formed, carbon black or the like may be used as a black pigment and/or a black dye, but one or more embodiments of the present disclosure is not limited thereto.

In addition, the pixel defining layer PDL may be formed of an inorganic material. For example, the pixel defining layer PDL may be formed including silicon nitride (SiNx), silicon oxide (SiOx), silicon oxynitride (SiOxNy), or the like. The pixel defining layer PDL may define the light-emitting regions PXA-B, PXA-G, and PXA-R. The light-emitting regions PXA-B, PXA-G, and PXA-R and the non-light-emitting region NPXA may be divided by (e.g., defined by) the pixel defining layer PDL.

Each of the light-emitting elements ED-1, ED-2, and ED-3 may include a first electrode EL1, a hole transport region HTR, light-emitting layers EML-B, EML-G, and EML-R, an electron transport region ETR, and a second electrode EL2. In the light-emitting elements ED-1, ED-2, and ED-3 included in the display device DD according to one or more embodiments, the first electrode EL1, the same description which has been given with reference to FIG. 4 and the like may be applied to the hole transport region HTR, the electron transport region ETR, and the second electrode EL2, except that the quantum dot complexes QD-C1, QD-C2, and QD-C3 included in the light-emitting layer EML-B, EML-G, and EML-R are different from each other. In one or more embodiments, each of the light-emitting elements ED-1, ED-2, and ED-3 may further include a capping layer between the second electrode EL2 and the encapsulation layer TFE.

The encapsulation layer TFE may cover the light-emitting elements ED-1, ED-2, and ED-3. The encapsulation layer TFE may be a single layer or a stack of a plurality of layers. The encapsulation layer TFE may be a thin-film encapsulation layer. The encapsulation layer TFE protects the light-emitting elements ED-1, ED-2, and ED-3. The encapsulation layer TFE may cover the upper surface of the second electrode EL2 disposed in the opening OH and may fill the opening OH.

In one or more embodiments, FIG. 15 and the like illustrates that the hole transport region HTR and the electron transport region ETR are provided as a common layer while covering the pixel defining layer PDL, but one or more embodiments of the present disclosure is not limited thereto. In one or more embodiments, the hole transport region HTR and the electron transport region ETR may be disposed in the opening OH defined in the pixel defining layer PDL.

For example, when the hole transport region HTR and the electron transport region ETR as well as the light-emitting layers EML-B, EML-G, EML-R are provided using an inkjet printing method, the hole transport region HTR, the light-emitting layer EML-B, EML-G, and EML-R, and the electron transport region ETR and the like may be provided corresponding to the openings OH defined between portions of the pixel defining layer PDL. However, one or more embodiments of the present disclosure are not limited thereto, the hole transport region HTR and the electron transport region ETR may not be patterned, and may be provided as one common layer while covering the pixel defining layer PDL, as illustrated in FIG. 15, regardless of a method of providing each functional layer.

In the display device DD of one or more embodiments illustrated in FIG. 15, all the light-emitting layers EML-B, EML-G, and EML-R of the first to third light-emitting elements ED-1, ED-2, and ED-3 have similar thicknesses, but one or more embodiments of the present disclosure are not limited thereto. For example, in one or more embodiments, the thicknesses of the light-emitting layers EML-B, EML-G, and EML-R of the first to third light-emitting elements ED-1, ED-2, and ED-3 may be different from each other.

Referring to FIG. 14, the blue light-emitting regions PXA-B and the red light-emitting regions PXA-R may be alternately arranged with each other along the first direction DR1 to form a first group PXG1. The green light-emitting regions PXA-G may be arranged with each other along the first direction DR1 to form a second group PXG2.

The first group PXG1 may be disposed to be spaced apart from the second group PXG2 in the second direction DR2. Each of the first group PXG1 and the second group PXG2 may be provided in plural. The first groups PXG1 and the second groups PXG2 may be alternately arranged with each other along the second direction DR2.

One green light-emitting region PXA-G may be disposed to be spaced apart from one blue light-emitting region PXA-B or one red light-emitting region PXA-R in a fourth direction DR4. The fourth direction DR4 may be a direction between the first direction DR1 and the second direction DR2.

The arrangement structure of the light-emitting regions PXA-B, PXA-G, and PXA-R illustrated in FIG. 14 may be called a PenTile®/PENTILE® structure (PENTILE® is a registered trademark owned by Samsung Display Co., Ltd.). However, the arrangement structure of the light-emitting regions PXA-B, PXA-G, and PXA-R in the display device DD according to one or more embodiments of the present disclosure is not limited to the arrangement structure illustrated in FIG. 14. For example, in one or more embodiments, the light-emitting regions may have a stripe structure in which the blue light-emitting region PXA-B, the green light-emitting region PXA-G, and the red light-emitting region PXA-R are alternately arranged with each other in sequence along the first direction DR1.

Referring to FIG. 15, the display device DD according to one or more embodiments may further include a light control layer PP. The light control layer PP may block or reduce external light provided to the display panel DP from the outside of the display device DD. The light control layer PP may block or reduce a part of the external light. The light control layer PP may serve as an anti-reflection function that minimizes or reduces the reflection by external light.

In the embodiment illustrated in FIG. 15, the light control layer PP may include a color filter layer CFL. For example, the display device DD according to one or more embodiments may further include a color filter layer CFL disposed on the light-emitting elements ED-1, ED-2, and ED-3 of the display panel DP.

In the display device DD of one or more embodiments, the light control layer PP may include a base layer BL and a color filter layer CFL.

The base layer BL may be a member that provides a base surface on which the color filter layer CFL and/or the like is disposed. The base layer BL may be a glass substrate, a metal substrate, a plastic substrate, and/or the like. However, one or more embodiments of the present disclosure are not limited thereto, and the base layer BL may be an inorganic layer, an organic layer, or a composite material layer (e.g., including an organic material and an inorganic material).

The color filter layer CFL may include a light blocking portion BM and a color filter portion CF. The color filter portion CF may include a plurality of filters CF-B, CF-G, and CF-R. For example, the color filter layer CFL may include a first filter CF-B transmitting (e.g., to transmit) first light, a second filter CF-G transmitting (e.g., to transmit) second light, and a third filter CF-R transmitting (e.g., to transmit) third light. For example, the first filter CF-B may be a blue filter, the second filter CF-G may be a green filter, and the third filter CF-R may be a red filter.

Each of the filters CF-B, CF-G, and CF-R may contain a polymer photosensitive resin and a pigment and/or dye. The first filter CF-B may contain a blue pigment and/or dye, the second filter CF-G may contain a green pigment and/or dye, and the third filter CF-R may contain a red pigment and/or dye.

However, one or more embodiments of the present disclosure are not limited thereto, and the first filter CF-B may not contain a pigment or a dye. The first filter CF-B may contain a polymer photosensitive resin and may not contain a pigment or a dye. The first filter CF-B may be transparent. The first filter CF-B may be formed of a transparent photosensitive resin.

The light blocking portion BM may be a black matrix. The light blocking portion BM may be formed by including an inorganic light blocking material and/or an organic light blocking material containing black pigment and/or black dye. The light blocking portion BM may prevent or reduce light leakage phenomenon and demarcate a boundary between adjacent filters CF-B, CF-G, and CF-R.

The color filter layer CFL may further include a buffer layer BFL. For example, the buffer layer BFL may be a protective layer that protects the filters CF-B, CF-G, and CF-R. The buffer layer BFL may be an inorganic material layer including at least one of silicon nitride, silicon oxide, or silicon oxynitride. The buffer layer BFL may be formed of a single layer or a plurality of layers.

In one or more embodiments illustrated in FIG. 15, the first filter CF-B of the color filter layer CFL is illustrated to overlap the second filter CF-G and the third filter CF-R, but one or more embodiments of the present disclosure are not limited thereto. For example, the first to third filters CF-B, CF-G, and CF-R may be divided by the light blocking portion BM and may not overlap with each other. In one or more embodiments, the first to third filters CF-B, CF-G, and CF-R may be respectively disposed to correspond to the blue light-emitting region PXA-B, the green light-emitting region PXA-G, and the red light-emitting region PXA-R.

In one or more embodiments, the display device DD according to one or more embodiments may include a polarizing layer in place of the color filter layer CFL as the light control layer PP. The polarizing layer may block or reduce external light provided from the outside to the display panel DP. For example, the polarizing layer may block or reduce some of the external light.

In one or more embodiments, the polarizing layer may reduce reflected light of external light generated from the display panel DP. For example, the polarizing layer may function to block or reduce reflected light when light provided from the outside of the display device DD enters the display panel DP and exits again. The polarizing layer may be a circular polarizer having an antireflection function, or the polarizing layer may include a linear polarizer and a λ/4 phase retarder. In one or more embodiments, the polarizing layer may be disposed and exposed on the base layer BL, or the polarizing layer may be disposed under the base layer BL.

Figure 16:
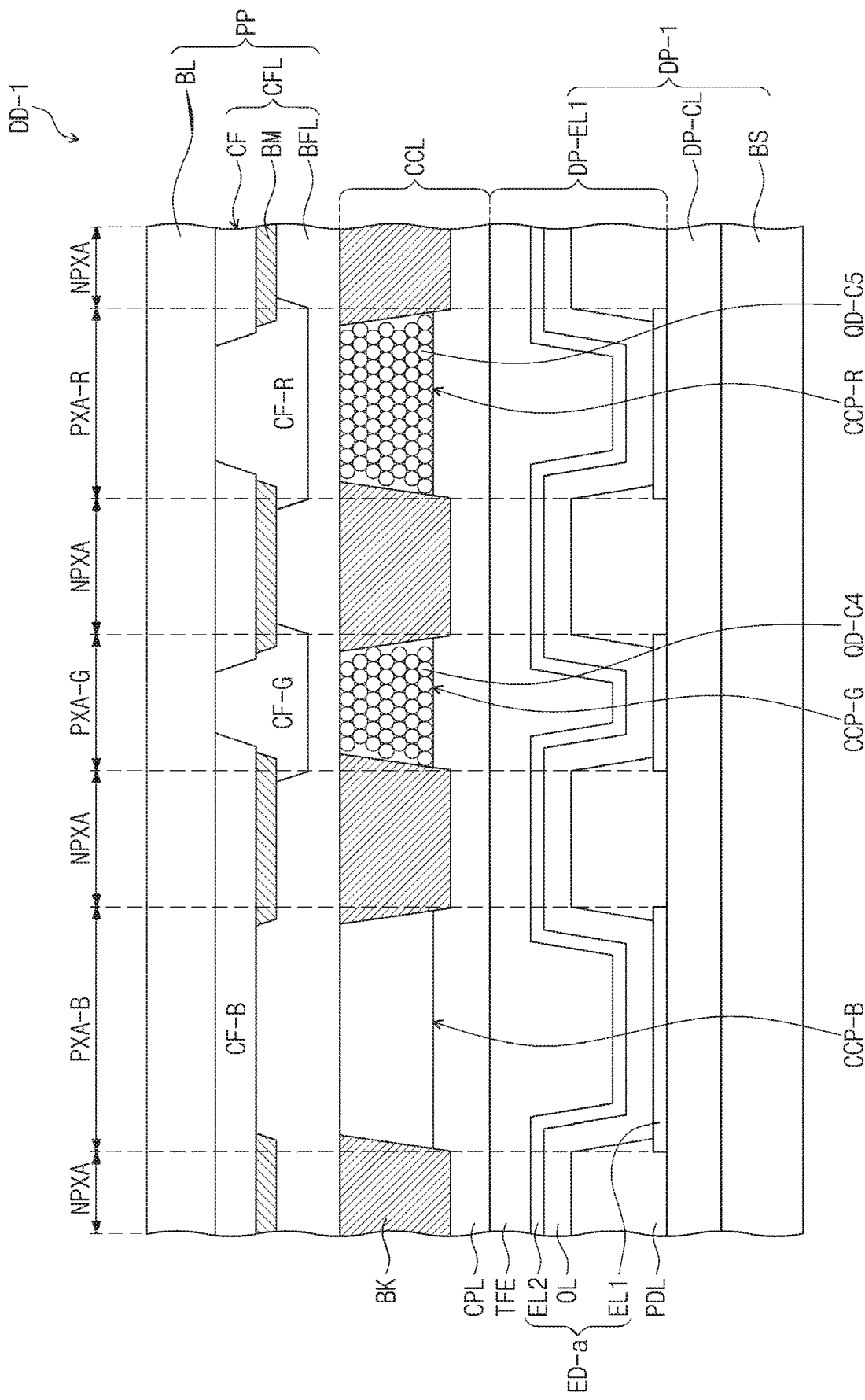
FIG. 16 is a cross-sectional view of a display device according to one or more embodiments.

FIG. 16 is a cross-sectional view of a display device DD-1 according to one or more other embodiments of the present disclosure. In the description of the display device DD-1 according to one or more embodiments, duplicate descriptions of the elements which have been described with reference to FIGS. 1 to 15 will not be provided herein, and differences will be mainly described.

Referring to FIG. 16, the display device DD-1 according to one or more embodiments may include a light conversion layer CCL disposed on the display panel DP-1. In addition, the display device DD-1 according to one or more embodiments may further include a color filter layer CFL. The color filter layer CFL may be disposed between the base layer BL and the light conversion layer CCL.

The display panel DP-1 may be a light-emitting display panel. For example, the display panel DP-1 may be an organic electroluminescence display panel or a quantum dot light-emitting display panel.

The display panel DP-1 may include a base substrate BS, a circuit layer DP-CL and a display element layer DP-EL1 provided on the base substrate BS.

The display element layer DP-EL1 includes a light-emitting element ED-a, and the light-emitting element ED-a includes the first electrode EU and the second electrode EL2 facing each other, and a plurality of layers OL disposed between the first electrode EL1 and the second electrode EL2. The plurality of layers OL may include the hole transport region HTR (FIG. 4), the light-emitting layer EML (FIG. 4), and the electron transport region ETR (FIG. 4). An encapsulation layer TFE may be disposed on the light-emitting element ED-a.

In the light-emitting element ED-a, the same description which has been made with reference to FIG. 4 may be applied to the first electrode EL1, the hole transport region HTR, the electron transport region ETR, and the second electrode EL2. However, the light-emitting layer in the light-emitting element ED-a included in the display panel DP-1 of one or more embodiments may include a host and a dopant, which are organic electroluminescent materials, or may include a quantum dot composite described in FIGS. 1 to 14 as above. The light-emitting element ED-a of the display panel DP-1 of one or more embodiments may emit blue light.

The light conversion layer CCL may include a plurality of partition wall portions BK spaced apart from each other and light control parts CCP-B, CCP-G, and CCP-R disposed between the partition wall portions BK. The partition wall portion BK may be formed of a polymer resin and a liquid repellent additive. The partition wall portion BK may be formed including a light absorbing material, or may be formed including a pigment and/or dye. For example, the partition wall portion BK may be formed including a black pigment and/or a black dye to form a black partition wall portion. When forming the black partition wall portion, carbon black and/or the like may be used as a black pigment and/or black dye, but one or more embodiments of the present disclosure are not limited thereto.

The light conversion layer CC includes a first light control part CCP-B transmitting (e.g., to transmit) the first light, a second light control part CCP-G having a fourth quantum dot complex QD-C4 that converts first light into second light, and a third light control part CCP-R having a fifth quantum dot complex QD-C5 that converts first light into third light. Second light may have a longer wavelength range than first light, and third light may have a longer wavelength range than first light and second light. For example, the first light may be blue light, the second light may be green light, and the third light may be red light. With regard to the quantum dot complexes QD-C4 and QD-C5 included in the light control parts CCP-B, CCP-G, and CCP-R, the same description of the quantum dot composite (e.g., the quantum dot complex QD-C) which has been given previously may be applied.

The light conversion layer CCL may further include a capping layer CPL. The capping layer CPL may be disposed on the light control parts CCP-B, CCP-G, and CCP-R and partition wall portion BK. The capping layer CPL may serve to prevent or reduce the permeation of moisture and/or oxygen (hereinafter, referred to as "moisture/oxygen"). The capping layer CPL may be disposed on the light control parts CCP-B, CCP-G, and CCP-R and may block or reduce the exposure of the light control parts CCP-B, CCP-G, and CCP-R to moisture/oxygen. The capping layer CPL may include at least one inorganic layer.

In one or more embodiments, the display device DD-1 according to one or more embodiments may further include a filler between the encapsulation layer TFE and the capping layer CPL.

The display device DD-1 according to one or more embodiments includes a color filter layer CFL disposed on the light conversion layer CCL, and the same description which has been given with reference to FIG. 15 may be applied to the color filter layer CFL and the base layer BL.

The quantum dot composition according to one or more embodiments of the present disclosure includes a quantum dot composite in which two different ligands each bind to the surface of the quantum dot. The first ligand binding to the quantum dot includes a crosslinkable functional group in the tail portion thereof, and the second ligand is shorter than the first ligand and may control charge mobility.

When a ligand binds to the surface of a quantum dot, the dispersibility and capping characteristics of the quantum dot in an organic solvent may be improved. However, when such quantum dot composite is applied to a light-emitting element, charge injection characteristics may be deteriorated, thereby reducing the luminous efficiency of the light-emitting element. In contrast, in the quantum dot composite according to one or more embodiments of the present disclosure, because the first ligand includes a crosslinkable functional group, a crosslinking reaction may be carried out in the light-emitting layer, and the distance between the quantum dots may be kept substantially constant. In addition, the stacking density of the quantum dots is increased and the voids are reduced, thereby making it possible to prevent or reduce the deterioration in a charge injection characteristic, and improve the luminous efficiency characteristics of the light-emitting element. In addition, because the second ligand improves charge mobility, the luminous efficiency characteristics may be improved.

The quantum dot composition of one or more embodiments includes heterogeneous ligands that bind to the surface of the quantum dot, and thus may prevent or reduce the deterioration of charge injection characteristics, even when applied to the light-emitting layer, so that the quantum dot composition may be used as a light-emitting layer material capable of exhibiting improved luminous efficiency characteristics.

The light-emitting element and the display device according to one or more embodiments may include, in the light-emitting layer, quantum dots that do not deteriorate (e.g., do not substantially deteriorate) the charge injection characteristic and thus exhibit improved luminous efficiency and device lifetime.

Although certain embodiments of the present disclosure have been described, it is understood that the present disclosure should not be limited to these embodiments, but various changes and modifications may be made by one ordinary skilled in the art within the spirit and scope of the present disclosure as hereinafter claimed.

Accordingly, the technical scope of the present disclosure should not be limited to the contents described in the detailed description of the specification, but should be determined by the claims and their equivalents.

What is claimed is:

1. A quantum dot composition comprising:
   a quantum dot;
   a first ligand represented by Formula A or Formula B; and
   a second ligand bonded to a surface of the quantum dot and being shorter in length than the first ligand:

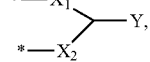

Formula A

Formula B wherein, in Formula A and Formula B,
X, $X_1$, and $X_2$ are each independently S or NH,
* is a position to which the quantum dot binds, and
Y is represented by any one of Formulae 1 to 7:

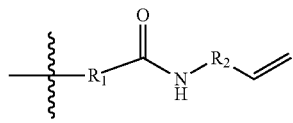
Formula 1

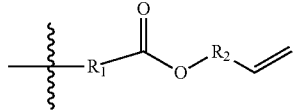
Formula 2

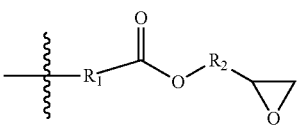
Formula 3

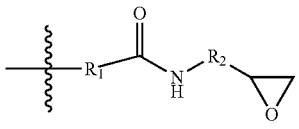
Formula 4

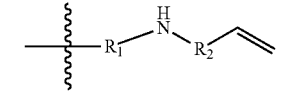
Formula 5

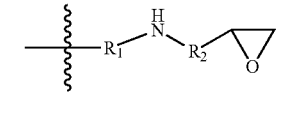
Formula 6

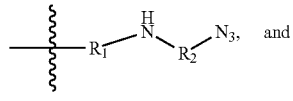
Formula 7 and wherein, in Formulae 1 to 7,

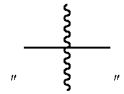

means a position connected to the X, $X_1$ or $X_2$, and
$R_1$ and $R_2$ are each independently an alkyl group having 1 to 20 carbon atoms, where the sum of carbon atoms of $R_1$ and $R_2$ is 20 or less.

2. The quantum dot composition of claim 1, wherein
the second ligand comprises a second head portion bonded to the surface of the quantum dot and a second tail portion, and
the second tail portion comprises at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, or an ethoxylated polyethylenimine moiety.

3. The quantum dot composition of claim 1, wherein the first ligand and the second ligand are each independently a monodentate ligand or a bidentate ligand.

4. The quantum dot composition of claim 2, wherein the second head portion comprises a thiol group, a dithioic acid group, a phosphine group, a catechol group, an amine group, and/or a carboxylic acid group.

5. The quantum dot composition of claim 2, wherein the electron-withdrawing group is a nitro group, a thioamide group, an amide group, a fluorine group, a cyano group, an ester group, and/or a carbonyl group, and
the electron-donating group is an aryl group having 6 to 20 ring-forming carbon atoms, an amine group, an alkoxy group, and/or a thioether group.

6. The quantum dot composition of claim 1, wherein the second ligand is represented by any one of Formulae 8 to 15:

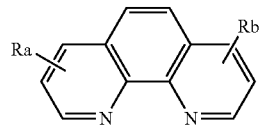
Formula 8

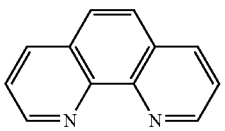
Formula 9

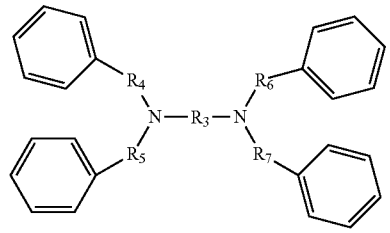
Formula 10

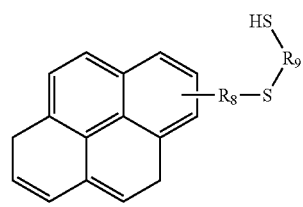
Formula 11

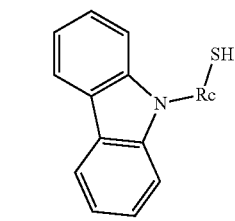
Formula 12

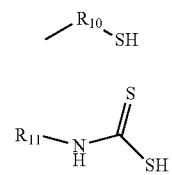
Formula 13

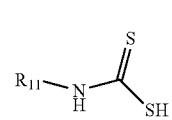
Formula 14

-continued

Formula 15

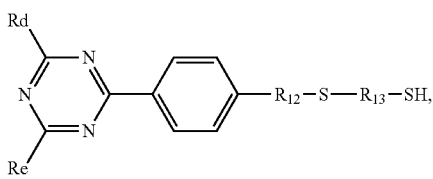

wherein, in Formulae 8 to 15,

Ra to Re are each independently an alkyl group having 1 to 3 carbon atoms or an aryl group having 6 to 12 ring-forming carbon atoms, $R_1$ to $R_9$, and $R_{12}$ and $R_{13}$ are each independently a direct bond or an alkyl group having 1 to 3 carbon atoms, and $R_{10}$ and $R_{11}$ are each independently an alkyl group having 3 to 8 carbon atoms.

7. The quantum dot composition of claim 1, further comprising an organic solvent, wherein the quantum dot is dispersed in the organic solvent.

8. A light-emitting element comprising:
a first electrode;
a second electrode facing the first electrode; and
a light-emitting layer between the first electrode and the second electrode, the light-emitting layer comprising a plurality of quantum dot complexes,
wherein each of the plurality of quantum dot complexes comprises a quantum dot, a first ligand bonded to a surface of the quantum dot, and a second ligand shorter in length than the first ligand and bonded to the surface of the quantum dot, and
the first ligand is to bind to another first ligand adjacent thereto,
wherein the first ligand is represented by Formula A or Formula B:

\*—X—Y  Formula A

\*—X$_1$  
\qquad\textbackslash Y,  Formula B  
\*—X$_2$ wherein, in Formula A and Formula B,
X, $X_1$, and $X_2$ are each independently S or NH,
\* is a position to which the quantum dot binds, and
Y is represented by any one of Formulae 1 to 7:

Formula 1

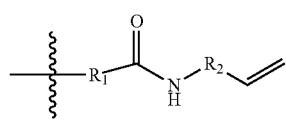

Formula 2

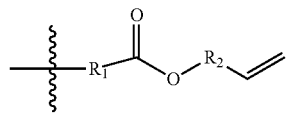

Formula 3

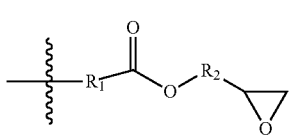

-continued

Formula 4

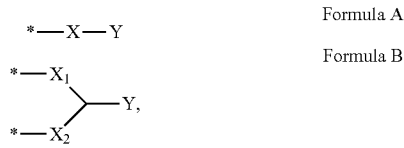

Formula 5

Formula 6

Formula 7 wherein, in Formulae 1 to 7

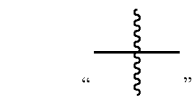

means a position connected to the X, $X_1$ or $X_2$, and $R_1$ and $R_2$ are each independently an alkyl group having 1 to 20 carbon atoms, where the sum of carbon atoms of $R_1$ and $R_2$ is 20 or less.

9. The light-emitting element of claim 8, wherein the second ligand comprises at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, or an ethoxylated polyethylenimine moiety.

10. An electronic device comprising a display device, wherein the display device comprises:
a display panel; and
a light conversion layer on the display panel, the light conversion layer comprising at least one light control part,
wherein the at least one light control part comprises a quantum dot, a first ligand bonded to a surface of the quantum dot, and a second ligand shorter in length than the first ligand, and
the first ligand is to bind to another first ligand bonded to an adjacent quantum dot, and
wherein the first ligand is represented by Formula A or Formula B:

\*—X—Y  Formula A

\*—X$_1$  
\qquad\textbackslash Y,  Formula B  
\*—X$_2$ wherein, in Formula A and Formula B,
X, $X_1$, and $X_2$ are each independently S or NH,
* is a position to which the quantum dot binds, and
Y is represented by any one of Formulae 1 to 7:

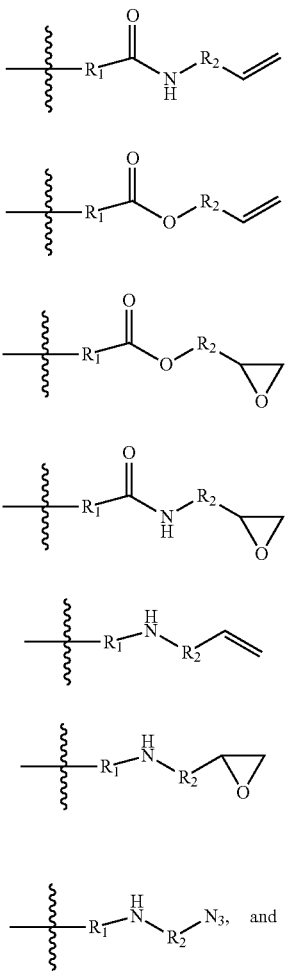

Formula 1

Formula 2

Formula 3

Formula 4

Formula 5

Formula 6

Formula 7 wherein, in Formulae 1 to 7

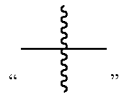

means a position connected to the X, $X_1$ or $X_2$, and
$R_1$ and $R_2$ are each independently an alkyl group having 1 to 20 carbon atoms, where the sum of carbon atoms of $R_1$ and $R_2$ is 20 or less.

11. The electronic device of claim 10, wherein
the display panel comprises a light-emitting element to generate first light, and
the light conversion layer comprises:
a first light control part to transmit first light,
a second light control part to convert first light into second light, and
a third light control part to convert first light into third light.

12. The electronic device of claim 10, wherein the first ligand comprises:
a first tail portion that is to bind to another first ligand bonded to another quantum dot.

13. The electronic device of claim 10,
wherein the second ligand comprises:
a second head portion comprising a hydrophilic group bonded to the surface of the quantum dot; and
a second tail portion comprising at least one of an alkyl group having a length of about 1.5 nm or less, an alkenyl group having a length of about 1.5 nm or less, a carbazole moiety, a triazine moiety, a pyrene moiety, an electron-withdrawing group, an electron-donating group, a polyethylenimine moiety, or an ethoxylated polyethylenimine moiety.

14. The electronic device of claim 11, further comprising a color filter layer on the light conversion layer,
wherein the color filter layer comprises:
a first filter to transmit first light;
a second filter to transmit second light; and
a third filter to transmit third light.

15. The electronic device of claim 11, wherein the electronic device is a television, a monitor, an external billboard, a personal computer, a notebook computer, a personal digital terminal, a car navigation unit, a game machine, a smartphone, a tablet, and/or a camera.

* * * * *